United States Patent
Inatsuka

(10) Patent No.: US 9,806,088 B2
(45) Date of Patent: Oct. 31, 2017

(54) SEMICONDUCTOR MEMORY DEVICE HAVING MEMORY CELLS ARRANGED THREE-DIMENSIONALLY AND METHOD OF MANUFACTURING THE SAME

(71) Applicant: TOSHIBA MEMORY CORPORATION, Tokyo (JP)

(72) Inventor: Takuya Inatsuka, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/418,983

(22) Filed: Jan. 30, 2017

(65) Prior Publication Data
US 2017/0236830 A1    Aug. 17, 2017

Related U.S. Application Data

(60) Provisional application No. 62/295,389, filed on Feb. 15, 2016.

(51) Int. Cl.
| | |
|---|---|
| *H01L 27/11531* | (2017.01) |
| *H01L 27/11526* | (2017.01) |
| *H01L 27/11548* | (2017.01) |
| *H01L 27/11573* | (2017.01) |
| *H01L 27/11575* | (2017.01) |
| *H01L 27/11582* | (2017.01) |
| *H01L 27/11556* | (2017.01) |
| *H01L 21/78* | (2006.01) |

(52) U.S. Cl.
CPC ........ *H01L 27/11531* (2013.01); *H01L 21/78* (2013.01); *H01L 27/11526* (2013.01); *H01L 27/11548* (2013.01); *H01L 27/11556* (2013.01); *H01L 27/11573* (2013.01); *H01L 27/11575* (2013.01); *H01L 27/11582* (2013.01)

(58) Field of Classification Search
USPC ........................................................ 257/620
See application file for complete search history.

(56) References Cited

U.S. PATENT DOCUMENTS

| | | | |
|---|---|---|---|
| 6,888,750 B2 * | 5/2005 | Walker | H01L 21/822 257/E21.606 |
| 7,046,550 B1 * | 5/2006 | Reohr | G11C 13/0004 365/185.13 |
| 9,356,034 B1 * | 5/2016 | Yada | H01L 27/11575 |

(Continued)

*Primary Examiner* — Zandra Smith
*Assistant Examiner* — Lawrence Tynes, Jr.
(74) *Attorney, Agent, or Firm* — Patterson & Sheridan, LLP

(57) ABSTRACT

A semiconductor memory device includes a substrate, a plurality of insulating layers and wiring layers that are alternately formed, and a plurality of first layers and second layers that are alternately formed. The substrate has a memory region extending in first and second directions along a surface of the substrate, a step region adjacent to the memory region in the first direction, and a peripheral region adjacent to the memory region and the step region in the second direction. The insulating layers and the wiring layers are formed on the memory region and the step region. The first and second layers are formed on the peripheral region. Each of the first layers is formed on a same level as and in contact with one of the insulating layers, and each of the second layers is formed on a same level as and in contact with one of the wiring layers.

20 Claims, 18 Drawing Sheets

(56) References Cited

U.S. PATENT DOCUMENTS

| | | | |
|---|---|---|---|
| 9,437,543 B2* | 9/2016 | Nakada | H01L 27/11556 |
| 9,443,910 B1* | 9/2016 | Fujiwara | H01L 27/2481 |
| 9,595,535 B1* | 3/2017 | Ogawa | H01L 27/11582 |
| 9,673,213 B1* | 6/2017 | Yu | H01L 27/11582 |
| 2005/0161794 A1 | 7/2005 | Kato et al. | |
| 2007/0042561 A1 | 2/2007 | Yamagata | |
| 2007/0210338 A1* | 9/2007 | Orlowski | H01L 29/66825 257/213 |
| 2008/0142927 A1 | 6/2008 | Ahn et al. | |
| 2009/0230449 A1* | 9/2009 | Sakaguchi | H01L 27/0688 257/298 |
| 2009/0310425 A1* | 12/2009 | Sim | H01L 27/11526 365/185.29 |
| 2012/0147644 A1* | 6/2012 | Scheuerlein | G11C 13/0002 365/51 |
| 2012/0241844 A1* | 9/2012 | Iguchi | H01L 21/28282 257/324 |
| 2015/0179660 A1* | 6/2015 | Yada | H01L 21/02164 257/321 |
| 2015/0279852 A1* | 10/2015 | Mizutani | H01L 27/11556 257/315 |
| 2015/0340316 A1* | 11/2015 | Or-Bach | G11C 5/025 257/2 |
| 2015/0364488 A1* | 12/2015 | Pachamuthu | H01L 29/665 257/314 |
| 2016/0064281 A1* | 3/2016 | Izumi | H01L 21/76816 257/315 |
| 2016/0172369 A1* | 6/2016 | Hu | H01L 27/11578 257/314 |
| 2016/0276359 A1* | 9/2016 | Oginoe | H01L 27/11582 |
| 2016/0343718 A1* | 11/2016 | Lu | H01L 27/1157 |
| 2016/0365352 A1* | 12/2016 | Nishikawa | H01L 27/11582 |
| 2017/0040337 A1* | 2/2017 | Kim | H01L 27/11582 |
| 2017/0141121 A1* | 5/2017 | Freeman | H01L 27/11582 |
| 2017/0148800 A1* | 5/2017 | Nishikawa | H01L 27/1157 |
| 2017/0179154 A1* | 6/2017 | Furihata | H01L 27/11582 |

* cited by examiner

SEMICONDUCTOR MEMORY DEVICE HAVING MEMORY CELLS ARRANGED THREE-DIMENSIONALLY AND METHOD OF MANUFACTURING THE SAME

CROSS-REFERENCE TO RELATED APPLICATIONS

This application is based upon and claims the benefit of priority from U.S. Provisional Patent Application No. 62/295,389, filed on Feb. 15, 2016, the entire contents of which are incorporated herein by reference.

FIELD

Embodiments described herein relate generally to a semiconductor memory device, in particular, one having memory cells arranged three-dimensionally, and a method of manufacturing the same.

BACKGROUND

Miniaturization of a semiconductor memory device is desired.

DETAILED DESCRIPTION

Figure 1:
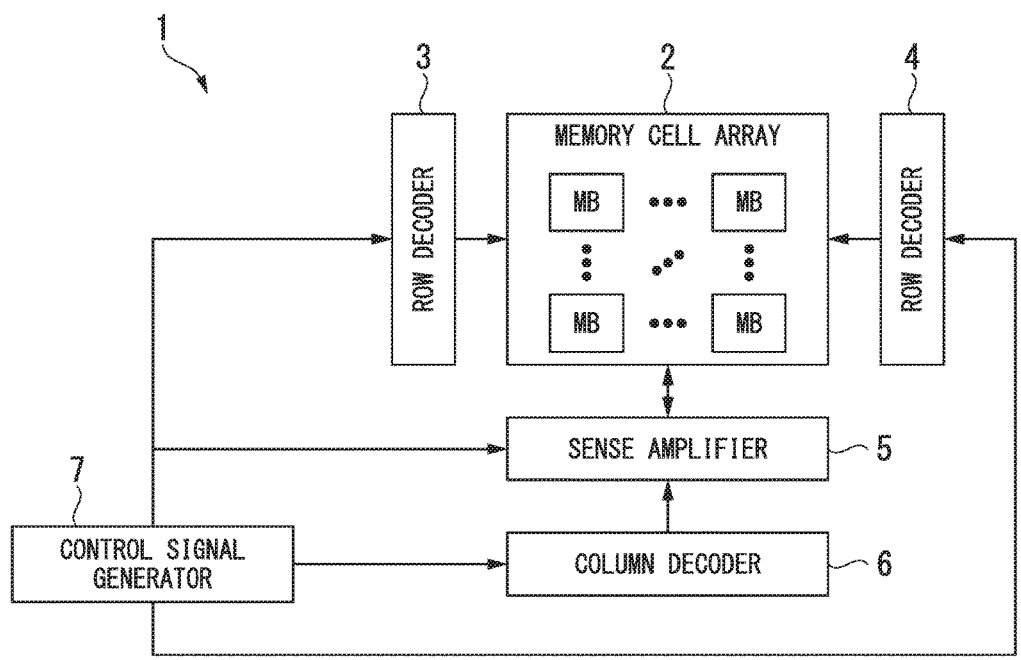
FIG. 1 is a block diagram of a system configuration of a semiconductor memory device according to a first embodiment.

A semiconductor memory device according to an embodiment includes a substrate, a plurality of insulating layers and a plurality of wiring layers that are alternately formed, and plurality of first layers and a plurality of second layers that are alternately formed. The substrate has a memory region extending in first and second directions along a surface of the substrate, a step region that is adjacent to the memory region in the first direction and extends in the second direction, and a non-memory peripheral region that is adjacent to the memory region and the step region in the second direction and extends in the first direction. The insulating layers and the wiring layers are formed on the memory region and the step region. Widths of the insulating layers on the step region in the first direction and widths of the wiring layers on the step region in the first direction, respectively, become narrower as a distance from the substrate increases. The first layers and the second layers are formed on the non-memory peripheral region of the substrate. Each of the first layers is formed on a same level as and in contact with one of the insulating layers, and each of the second layers is formed on a same level as and in contact with one of the wiring layers.

Hereinafter, a semiconductor memory device, a wafer, and a method of manufacturing a semiconductor memory device according to embodiments will be described with reference to the accompanying drawings. In the following description, configurations having the same or similar functions are denoted with the same reference numerals, and repeated description thereof may be omitted. The drawings are schematic, and the number, thickness, width, a ratio, or the like of components may be different from an actual one. Further, some parts are hatched in the drawings. The hatching may be applied on regions other than a cross-section in order to clarify shapes of the components. Further, in a case in which "connection" is simply described, this is not limited to a case where two members are physically connected, and also includes a case where two members are electrically connected.

First Embodiment

A first embodiment will be described with reference to FIGS. 1 to 10.

First, an entire configuration of a semiconductor memory device 1 of this embodiment will be described. The semiconductor memory device 1 of the present embodiment is a nonvolatile semiconductor memory device and is, for example, a NAND-type flash memory.

FIG. 1 is a block diagram illustrating a system configuration of the semiconductor memory device 1.

As illustrated in FIG. 1, the semiconductor memory device 1 includes a memory cell array 2, row decoders 3 and 4, a sense amplifier 5, a column decoder 6, and a control signal generator 7.

The memory cell array 2 includes a plurality of memory blocks MB. Each memory block MB includes a plurality of memory cells MC (see FIG. 2) that are three-dimensionally arranged. The row decoders 3 and 4 decode a block address signal or the like, and control a writing operation and a reading operation of data with respect to the memory cell array 2, for example. The sense amplifier (e.g., sense amplifier circuit) 5 detects and amplifies an electrical signal which flows in the memory cell array 2 during the reading operation. The column decoder 6 decodes a column address signal and controls the sense amplifier 5. The control signal generator 7 generates control signals to control the row decoders 3 and 4, the sense amplifier 5, and the column decoder 6.

Figure 2:
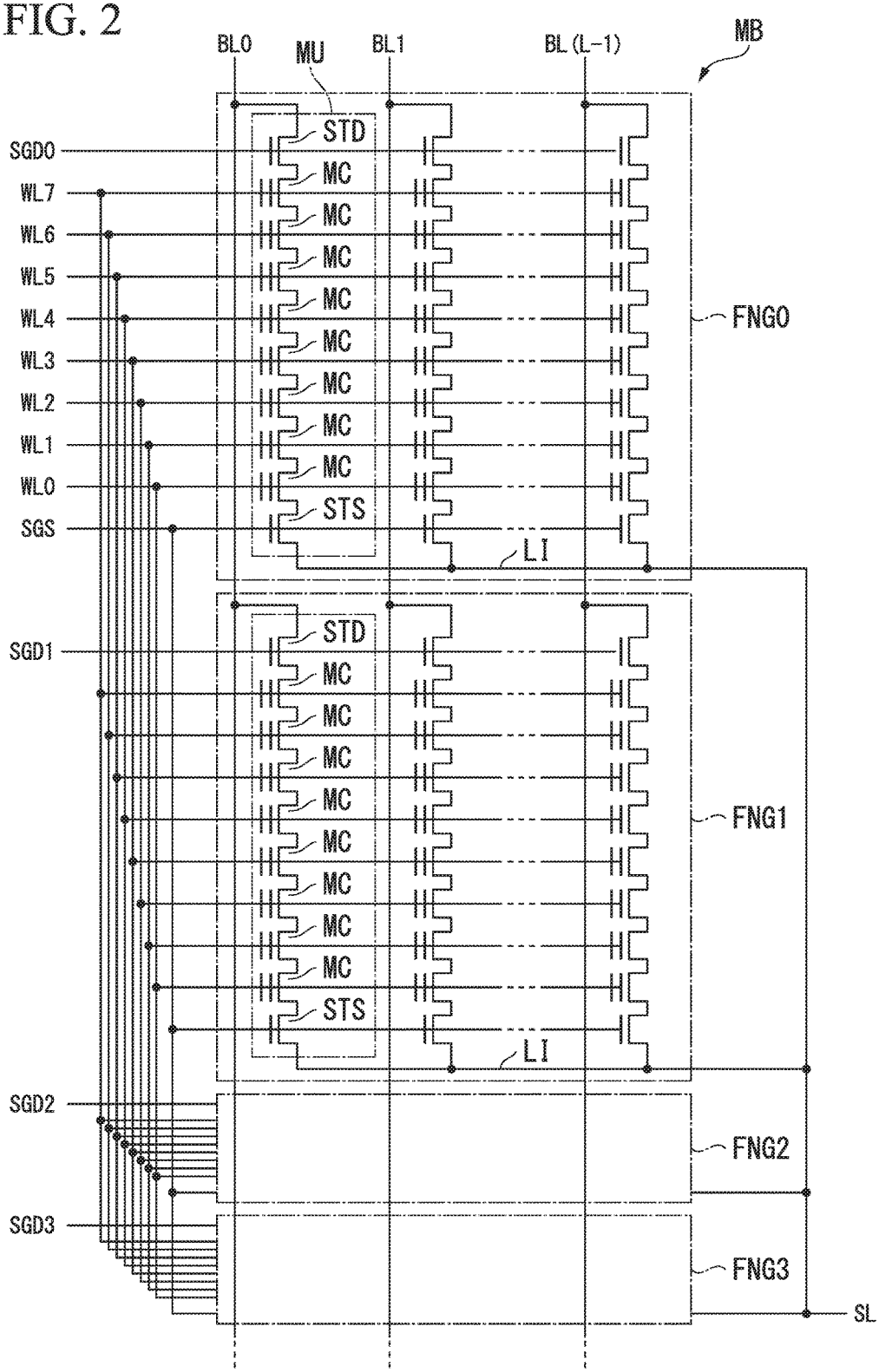
FIG. 2 illustrates an equivalent circuit of a memory cell array according to the first embodiment.

Next, a circuit configuration of the memory cell array 2 will be described. FIG. 2 illustrates an equivalent circuit of the memory cell array 2 according to the present embodiment.

As illustrated in FIG. 2, each memory block MB includes a plurality of fingers FNG (FNG0, FNG1, . . . ). Each finger FNG includes a plurality of memory cell units MU (described below). In each finger FNG, one end of each memory cell unit MU is electrically connected to a corresponding bit line BL (BL0, BL1, . . . ). The other end of each memory cell unit MU is electrically connected to a common source line SL via a source contact LI.

Each memory cell unit MU includes a plurality of memory cells MC, a source-side selection transistor STS, and a drain-side selection transistor STD.

In each memory cell unit MU, the plurality of memory cells MC is electrically connected in series. Further, each memory cell MC is a transistor including a semiconductor layer, a charge storage layer, and a control gate. Each of the memory cells MC accumulates charge in the charge storage layer according to a voltage applied to the control gate. Each of the word lines WL (WL0, WL1, . . . ) is commonly connected to the control gates of the plurality of memory cells MC located at a same row of different memory cell units MU across all fingers FNG in the memory block MB. The plurality of memory cells MC are electrically connected to the row decoder 3 or the row decoder 4 via the corresponding word line WL.

The source-side selection transistor STS is connected between the source contact LI and the plurality of memory cells MC of the same memory cell unit MU. A source-side selection gate line SGS is commonly connected to control gates of the source-side selection transistors STS in a memory block MB. The source-side selection gate line SGS is electrically connected to the row decoder 3 or the row decoder 4. The source-side selection gate line SGS controls the electrical connection of the memory cell units MU of a memory block MB to a semiconductor substrate 10 (see FIG. 3).

The drain-side selection transistor STD is connected between the bit line BL and the plurality of memory cells MC of the same memory cell unit MU. Each of the drain-side selection gate lines SGD (SGD0, SGD1, . . . ) is connected to control gates of the drain-side selection transistors STD of the corresponding finger FNG. The drain-side selection gate line SGD is electrically connected to the row decoder 3 or the row decoder 4. The drain-side selection gate line SGD controls the electrical connection of the memory cell units MU to the bit lines BL.

Next, an entire arrangement of the components of the semiconductor memory device 1 will be described.

Figure 3:
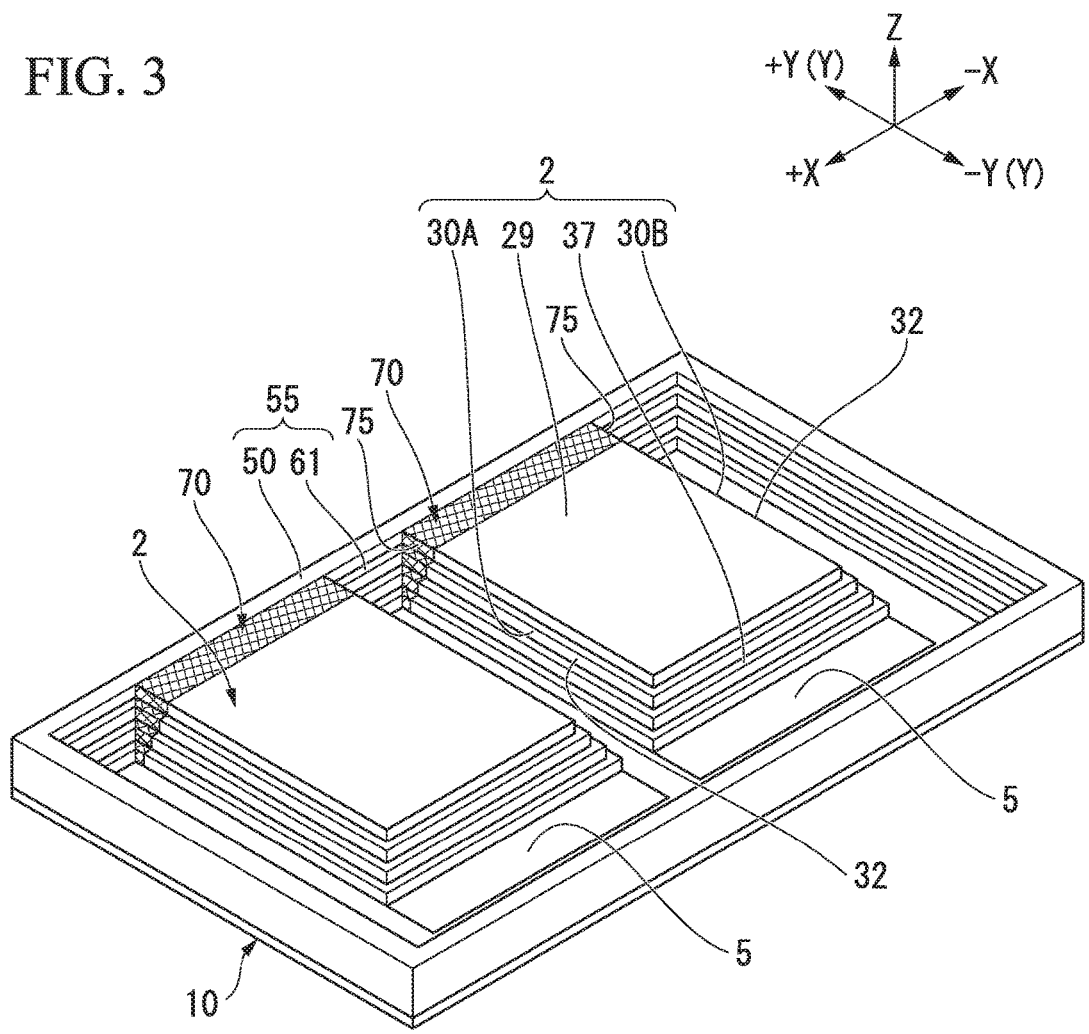
FIG. 3 is a perspective view of an internal configuration of the semiconductor memory device according to the first embodiment.

FIG. 3 illustrates an entire arrangement of the components of the semiconductor memory device 1. Some of the conductive lines, contact plugs 34 which will be described below, and an insulating member are not illustrated in FIG. 3.

Here, +X direction, −X direction, +Y direction, −Y direction, and Z direction are defined. +X direction, −X direction, +Y direction, and −Y direction are directions along a surface of the semiconductor substrate 10. Further, +X direction is a direction from a memory region 29 to one contact region 30A. +X direction is an example of a "first direction". −X Direction is a direction opposite to +X direction. −X direction is another example of the "first direction". +Y direction intersects and is substantially perpendicular to +X direction. +Y direction is an example of a "second direction". −Y direction is a direction opposite to +Y direction. −Y direction is an example of a "third direction". When +Y direction and −Y direction are not distinguished from each other, +Y direction and −Y direction are simply referred to as "Y direction". Z direction is a direction intersecting and is substantially perpendicular to X direction and Y direction. Z direction is a thickness direction of the semiconductor substrate 10.

As illustrated in FIG. 3, the semiconductor memory device 1 includes the semiconductor substrate 10, a plurality of (e.g., two) memory cell arrays 2, a plurality of (e.g., two) sense amplifiers 5, a non-memory region 55, and a plurality of (e.g., two) stacked sections 70.

The semiconductor substrate 10 is an example of a "substrate" and is formed in a plate shape.

Each of the memory cell arrays 2 includes the memory region (i.e., memory cell region) 29, contact regions 30A and 30B, and a cell array dummy staircase section 37. The "memory region" in the present embodiment is a region in which a plurality of memory cells is formed. The contact region 30A is located on a side of the memory region 29 in +X direction. The other contact region 30B is located on a side of the memory region 29 in −X direction. The "contact region" in the present embodiment includes a staircase section to be described below (e.g., staircase section 32), and is a region in which a contact plug for applying voltages to the memory region 29 is provided. The cell array dummy staircase section 37 is located on a side of the memory region 29 in −Y direction. The cell array dummy staircase section 37 is a staircase section which is incidentally (i.e., resultantly) formed when the staircase sections 32 of the contact regions 30A and 30B are formed.

The plurality of sense amplifiers 5 is located on sides of the plurality of memory cell arrays 2 in −Y direction, respectively. The sense amplifiers 5 are provided on, for example, the semiconductor substrate 10.

The non-memory region 55 is adjacent to a circumferential edge of the semiconductor substrate 10 and is provided along the circumferential edge of the semiconductor substrate 10. The "non-memory region" in the present embodiment refers to a region which includes a stacked structure including conductive layers (or remaining sacrificial layers) and insulating layers stacked alternately, in which memory cells are not provided, and which may be a region outside the stacked section 70 as described below. At least part of the non-memory region 55 is formed on a side of the memory region 29 in +Y direction. The non-memory region 55 includes a kerf region (i.e., scribe line region) 50 and a kerf dummy staircase section 61. The kerf region 50 is formed in a frame shape that surrounds the plurality of memory cell arrays 2 and the plurality of sense amplifiers 5. The kerf dummy staircase section 61 is provided along the kerf region 50 and is adjacent to the kerf region 50. The kerf dummy staircase section 61 is provided on an inner side of the semiconductor memory device 1 with respect to the kerf region 50.

The stacked section 70 is formed between the memory cell array 2 and the non-memory region 55 in Y direction. The stacked section 70 is referred to herein also as an "intermediate section". The stacked section 70 is a connection section that connects the memory cell array 2 and the non-memory region 55 with a stacked structure therebetween. The stacked section 70 of the present embodiment includes dummy staircase sections 75. The dummy staircase section 75 of the stacked section 70 is formed between the staircase section 32 of the memory cell array 2 and the kerf dummy staircase section 61.

Next, the respective configurations of the memory cell array 2 will be described in detail.

First, a configuration common to the memory region 29, the contact regions 30A and 30B, and the cell array dummy staircase section 37 of the memory cell array 2 will be described.

Figure 4:
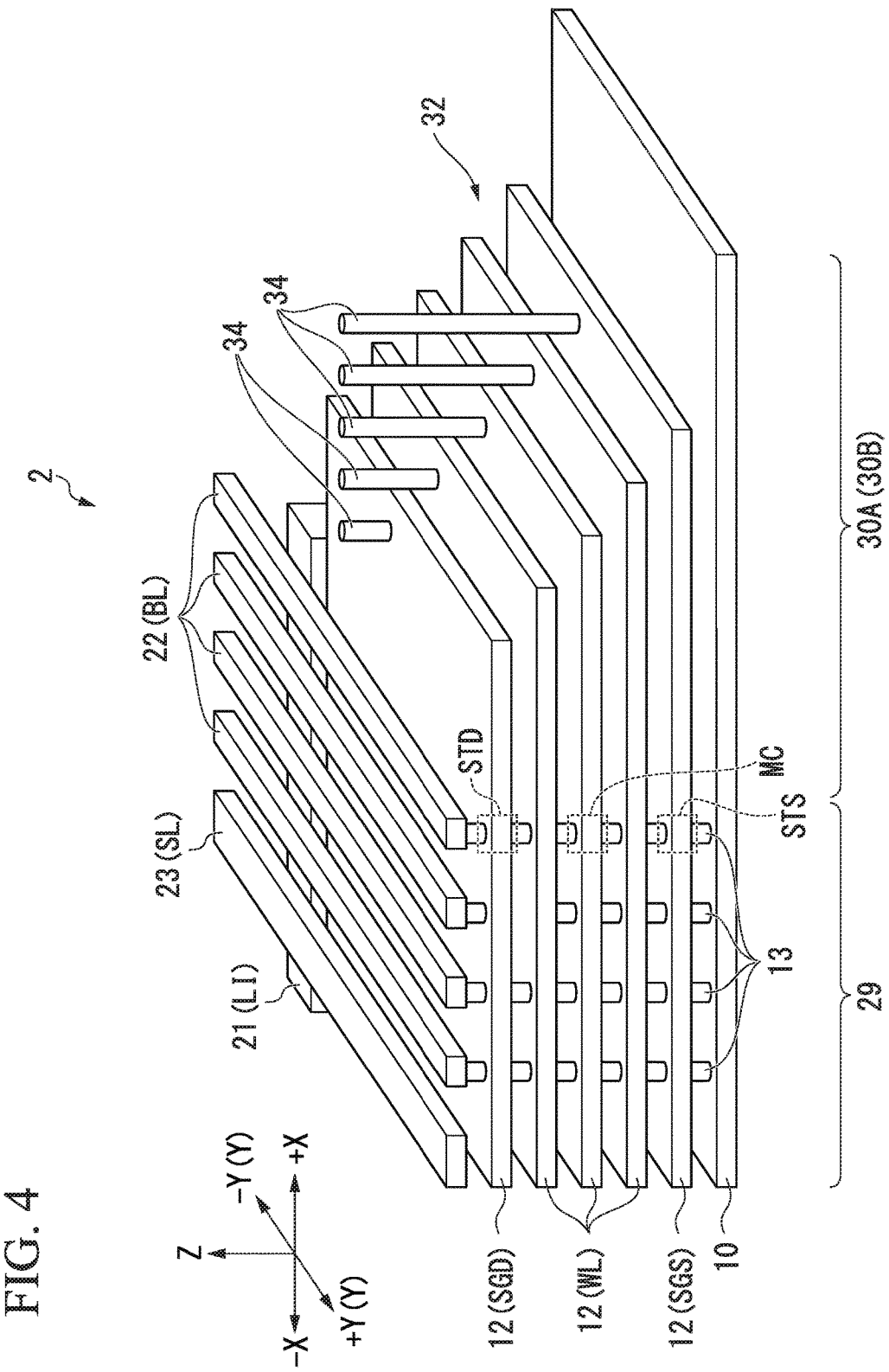
FIG. 4 is a perspective view of the memory cell array according to the first embodiment.

FIG. 4 schematically illustrates a part of the memory cell array 2 of the present embodiment.

The memory cell array 2 illustrated in FIG. 4 includes a plurality of insulating layers 11 (shown in FIG. 8) and a plurality of conductive layers 12.

The plurality of insulating layers 11 and the plurality of conductive layers 12 are alternately stacked on the semiconductor substrate 10. Each insulating layer 11 is made of, for example, silicon oxide ($SiO_2$). Each conductive layer 12 is made of, for example, tungsten (W) or polysilicon (polysilicon). The plurality of insulating layers 11 and the plurality of conductive layers 12 are provided over the memory region 29, the contact regions 30A and 30B, and the cell array dummy staircase section 37. In other words, the memory region 29, the contact regions 30A and 30B, and the cell array dummy staircase section 37 have the same stacked structure as one another.

The plurality of conductive layers 12 form the plurality of word lines WL, the source-side selection gate line SGS, and the drain-side selection gate line SGD. For example, one of the conductive layers 12 closest to the semiconductor substrate 10 forms the source-side selection gate line SGS. For example, one of the conductive layers 12 farthest from the semiconductor substrate 10 forms the drain-side selection gate line SGD. The other conductive layers 12 located between the above-described two conductive layers 12 form the plurality of word lines WL. Although the drain-side selection gate line SGD is schematically illustrated in a plate shape in FIG. 4, the drain-side selection gate line SGD is actually divided into a plurality of regions in Y direction. Further, the contact plug 34 to be described below is connected to each divided region of the drain-side selection gate line SGD.

Here, the insulating layer 11 is an example of a "first layer part" and a "first film". The conductive layer 12 is an example of a "second layer part" and a "second film". The "first layer part" of the present embodiment corresponds to an insulating layer included in the memory cell array. The "memory cell array" of the present embodiment corresponds to a stacked body (i.e., stacked structure) including the memory region and the contact region. For example, the "first layer part" is an insulating layer over the memory region and the contact region. The "second layer part" of the present embodiment corresponds to a conductive layer included in the memory cell array. For example, the "second layer part" is a conductive layer over the memory region and the contact region.

Next, the memory region 29 will be described.

As illustrated in FIG. 3, the memory region 29 is formed in a substantially rectangle shape, for example. The memory region 29 has at least a first side and a second side. The second side is adjacent to and connected to the first side. The second side is extends in a direction that is different from a direction in which the first side extends.

As illustrated in FIG. 4, the memory region 29 includes a plurality of memory pillars 13, a conductive layer 21, and conductive lines 22 and 23.

Each memory pillar 13 extends in Z direction, and passes through the source-side selection gate line SGS, the plurality of word lines WL, and the drain-side selection gate line SGD. A source-side selection transistor STS is formed at an intersection of each memory pillar 13 and the source-side selection gate line SGS. A memory cell MC is formed at an intersection of each memory pillar 13 and each of the word lines WL. A drain-side selection transistor STD is formed at an intersection of each memory pillar 13 and the drain-side selection gate line SGD.

The conductive layer 21 faces side surfaces of the plurality of conductive layers 12 in −Y direction. The conductive layer 21 extends in X direction. The conductive layer 21 is in contact with the semiconductor substrate 10 and forms the source contact LI that electrically connects the source lines SL and the semiconductor substrate 10.

The conductive lines 22 and 23 are formed on an end of the memory pillars 13 opposite to an end electrically connected to the semiconductor substrate 10. The plurality of conductive lines 22 and 23 are arranged with intervals in +X direction, and extend in Y direction. Each of the conductive lines 22 is electrically connected to a plurality of memory pillars 13 and forms the bit line BL. On the other hand, the conductive line 23 is electrically connected to the conductive layer 21 and forms the source line SL.

Next, the contact regions 30A and 30B will be described.

As illustrated in FIG. 4, each of the contact regions 30A and 30B includes the staircase section 32 in which a plurality of conductive layers 12 are arranged in a stair shape, and a plurality of contact plugs 34. The stair section 32 is adjacent to the first side of the memory region 29. The "staircase section" in the present embodiment refers to a collection of end portions of the plurality of conductive layers 12 of which lengths in a certain direction are different. The "staircase section" may also be referred to as "stair section" or "stair-step structure". In the staircase section 32 of each of the contact regions 30A and 30B, lengths of the plurality of conductive layers 12 in +X direction (or −X direction) (i.e., lengths of projections from the memory region 29) are different from one another. Among the plurality of conductive layers 12, the closer the conductive layer 12 is to the semiconductor substrate 10, the longer the conductive layer 12 extends in +X direction (or −X direction). The ends of the plurality of conductive layers 12 do not overlap each other in Z direction. The staircase section 32 is an example of the "first staircase section".

The contact plugs 34 are formed in the contact regions 30A and 30B. The contact plug 34 is an example of a "contact." Each of the contact plugs 34 is a columnar via that extends in Z direction. Each contact plug 34 is electrically connected to the row decoder 3 or the row decoder 4 via a conductive line (not illustrated). The contact plug 34 is made of, for example, tungsten (W). The contact plugs 34 are connected to the end portions of the conductive layers 12 that form the word lines WLs, the source-side selection gate line SGS, and the drain-side selection gate line SGD, respectively. Although illustrated together schematically in FIG. 4, the contact plugs 34 connected to the word lines WLs and the source-side selection gate line SGS, and the contact plug 34 connected to the drain-side selection gate line SGD, are actually separately arranged in the contact regions 30A and 30B, respectively.

Figure 5:
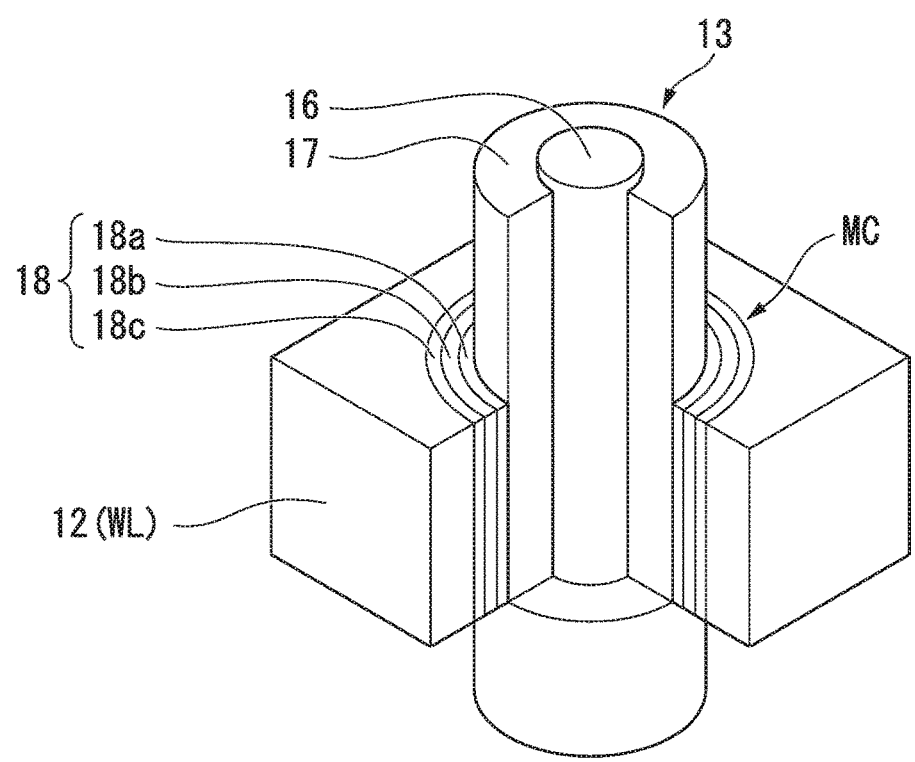
FIG. 5 is a perspective view of a memory cell according to the first embodiment.

Next, an example of the memory cell MC will be described. FIG. 5 illustrates a configuration of the memory cell MC.

As illustrated in FIG. 5, the memory cell MC is formed at an intersection between the conductive layer 12 and the memory pillar 13. The memory pillar 13 includes a core insulating layer (pillar) 16 and a semiconductor layer 17.

The core insulating layer 16 is made of, for example, silicon oxide ($SiO_2$). The semiconductor layer 17 covers a side surface (e.g., peripheral surface) of the core insulating layer (pillar) 16. The semiconductor layer 17 is made of, for example, polysilicon (Poly-Si), and functions as a channel of the memory cell MC.

The memory cell MC includes a multilayer film 18 between the conductive layer 12 and the semiconductor layer 17 of the memory pillar 13. The multilayer film 18 includes a tunnel insulating film 18a, a charge storage layer 18b, and a cover insulating layer 18c. The tunnel insulating film 18a is made of, for example, silicon oxide ($SiO_2$). The charge storage layer 18b is made of a material that can store an electrical charge, such as, for example, silicon nitride (SiN). The cover insulating layer 18c is made of, for example, silicon oxide ($SiO_2$). When a voltage is applied to the word line WL and the bit line BL, charge is stored in the charge storage layer 18b.

The source-side selection transistor STS and the drain-side selection transistor STD may also have the same configuration as the memory cell MC illustrated in FIG. 5.

Next, the non-memory region 55 will be described. The non-memory region 55 includes the kerf region 50 and the kerf dummy staircase section 61, as described above.

Figure 6:
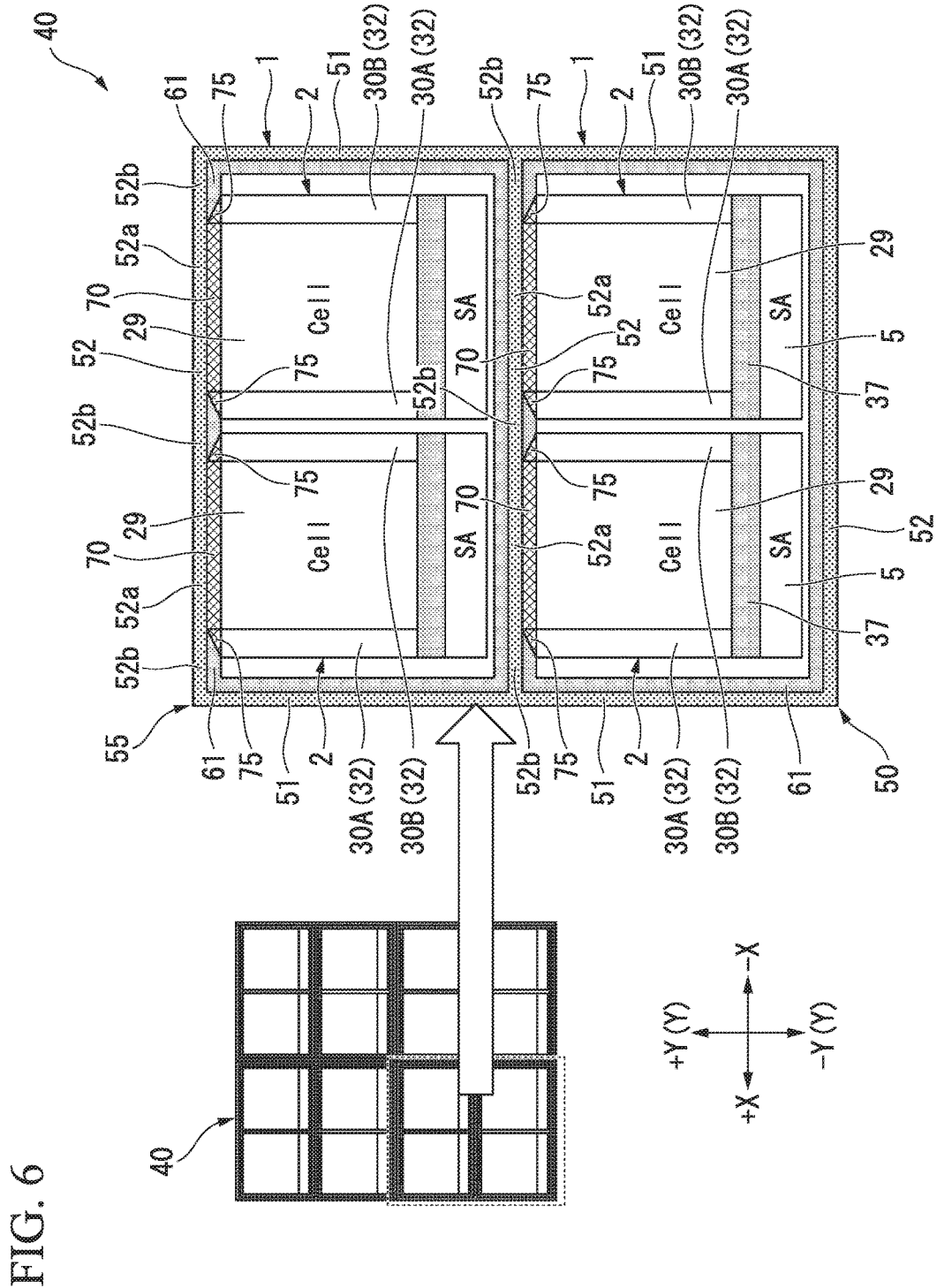
FIG. 6 is a plan view of a part of a wafer including the semiconductor memory device according to the first embodiment.

FIG. 6 is a plan view of a part of a wafer (e.g., semiconductor wafer) 40 before being diced into a plurality of semiconductor memory devices 1. That is, the wafer 40 includes a plurality of semiconductor memory devices 1. The plurality of semiconductor memory devices 1 are arranged adjacent to one another.

As illustrated in FIG. 6, the kerf region 50 is formed in boundaries of the plurality of semiconductor memory devices 1. The kerf region 50 is a region in which a cut surface (e.g., cutting line) is formed when the wafer 40 is diced into the plurality of semiconductor memory devices 1. That is, the plurality of semiconductor memory devices 1 is formed by dicing the wafer 40 along the kerf region 50.

More specifically, the kerf region 50 has a certain width in a direction orthogonal to the cut surface to allow displacement of the cut surface. Therefore, a part of the kerf region 50 remains in the semiconductor memory device 1 after the dicing. In the present embodiment, the kerf region 50 remaining in the semiconductor memory device 1 is also referred to as the "kerf region 50".

Further, in the present embodiment, the kerf region 50 includes a pair of first kerf regions 51 and a pair of second kerf regions 52. Each of the first kerf regions 51 and the second kerf regions 52 is located in the boundaries of the plurality of semiconductor memory devices 1.

The pair of first kerf regions 51 is formed on sides of the semiconductor memory device 1 in +X direction and −X direction. Each of the first kerf regions 51 faces the staircase section 32 of memory cell array 2 of the semiconductor memory device 1.

The pair of second kerf regions 52 is formed on sides of the semiconductor memory device 1 in +Y direction and −Y direction. The second kerf regions 52 are formed along a direction intersecting the first kerf regions 51 and are connected to the pair of first kerf regions 51.

As illustrated in FIG. 6, each of the second kerf regions 52 includes a first portion (i.e., a first sub region) 52a and a second portion (i.e., a second sub region) 52b. The first portion 52a is formed on a side of the memory region 29 in +Y direction. The second portion 52b extends in +X direction or −X direction from the first portion 52a.

Figure 7:
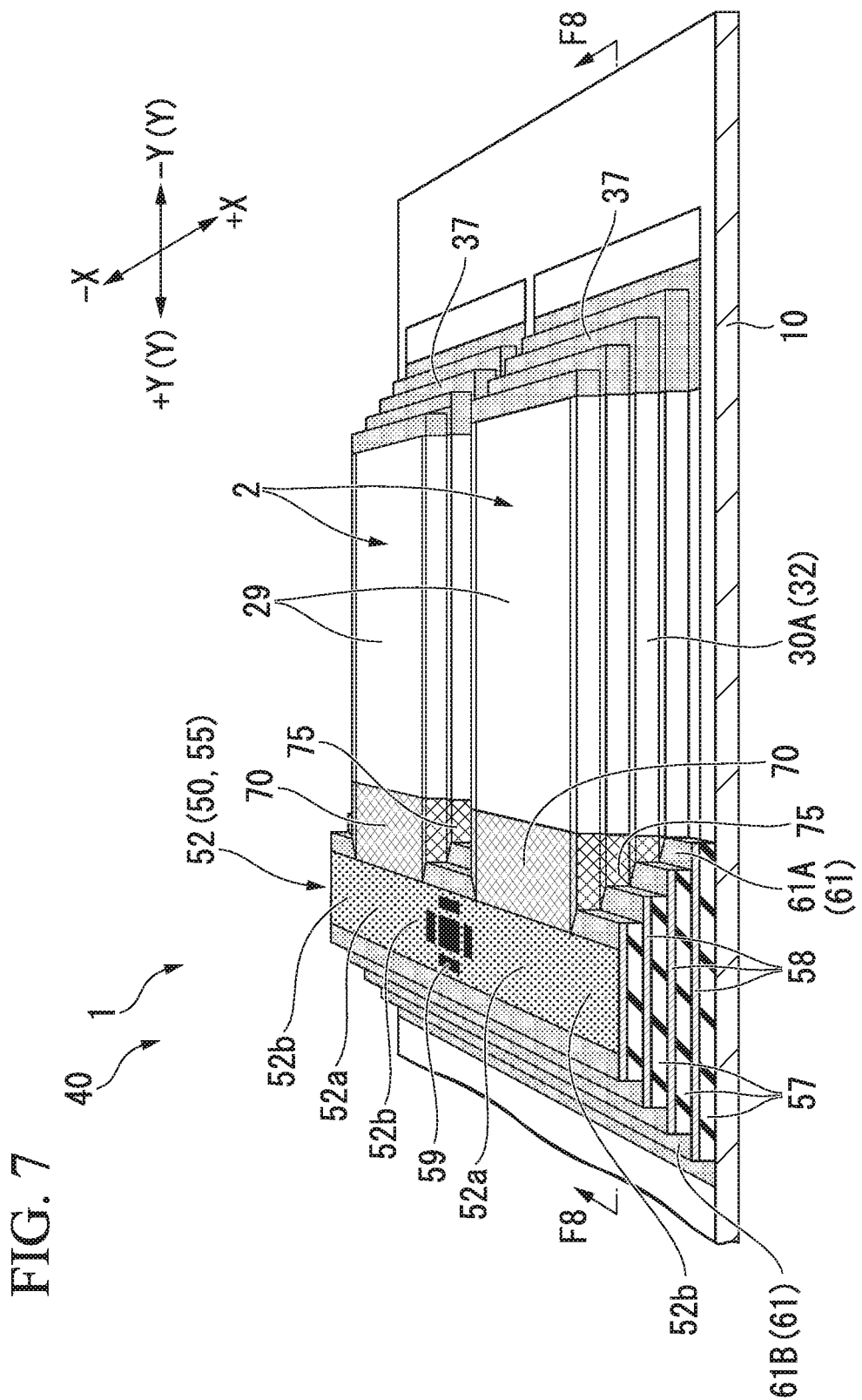
FIG. 7 is a perspective view of a part of the wafer.

FIG. 7 is a perspective view of a part of the wafer 40 according to the present embodiment.

As illustrated in FIG. 7, the non-memory region 55 (i.e., the kerf region 50 and the kerf dummy staircase section 61) has substantially the same stacked structure as that of the memory region 29. That is, the non-memory region 55 includes a plurality of insulating layers 57 and a plurality of conductive layers 58 that are alternately stacked on the semiconductor substrate 10. The insulating layers 57 and the conductive layers 58 of the non-memory region 55 are substantially simultaneously stacked in the same process as the insulating layers 11 and conductive layers 12 of the memory region 29, respectively. The plurality of insulating layers 57 and the plurality of conductive layers 58 are formed over the kerf region 50 and the kerf dummy staircase section 61 of the non-memory region 55. The insulating layer 57 is an example of each of "third layer part" and "third film." The conductive layer 58 is an example of each of "fourth layer part" and "fourth film." "Third layer part" in the present embodiment corresponds to an insulating layer included in the non-memory region 55. "Fourth layer part" in the present embodiment corresponds to a layer included in the non-memory region 55, which is a conductive layer or a sacrificial layer (described below) that has not been replaced with the conductive layer. For example, each of the "third layer part" and the "fourth layer part" is formed over the plurality of semiconductor memory devices 1 adjacent to each other.

As illustrated in FIG. 7, the kerf region 50 includes a plurality of insulating layers 57 and a plurality of conductive layers 58, and has substantially the same height as the memory region 29 with respect to the semiconductor substrate 10. For example, an alignment mark 59 is formed in the kerf region 50. The alignment mark 59 is a mark that is used for alignment during a process of manufacturing the semiconductor memory device 1. For example, the alignment mark 59 is a lithographic mark that is used for alignment during a lithographic process. The alignment mark 59 is not limited to the above lithographic mark, and may be an alignment mark that is used during other processes. At least a portion of the alignment mark 59 may be left in the kerf region 50 of the diced semiconductor memory device 1.

Next, the kerf dummy staircase section 61 will be described.

The kerf dummy staircase section 61 is formed along the kerf region 50 (i.e., the first and second kerf regions 51 and 52) (see FIG. 6). In the kerf dummy staircase section 61, the plurality of conductive layers 58 is arranged in a stair shape. The kerf dummy staircase section 61 gradually becomes lower toward the inner side of each semiconductor memory device 1. The kerf dummy staircase section 61 is a staircase section which is incidentally (i.e., resultantly) formed in accordance with the formation of the staircase sections 32 of the contact regions 30A and 30B.

Here, as illustrated in FIG. 7, in the wafer 40, the second kerf region 52 is provided in a boundary between one semiconductor memory device 1 and another semiconductor memory device 1. Further, one kerf dummy staircase section 61 is formed on a side of the second kerf region 52 in −Y direction. Another kerf dummy staircase section 61 is formed on a side of the second kerf regions 52 in +Y direction. Hereinafter, the kerf dummy staircase section 61 formed on the side of the second kerf region 52 in −Y direction is referred to as a kerf dummy staircase section 61A. Similarly, the kerf dummy staircase section 61 formed on the side of the second kerf region 52 in +Y direction is referred to as a kerf dummy staircase section 61B.

The kerf dummy staircase section 61A is formed adjacent to the second portion 52b of the second kerf region 52. In the kerf dummy staircase section 61A, lengths of the plurality of conductive layers 58 in −Y direction are different from one another. That is, in the kerf dummy staircase section 61A, among the plurality of the conductive layers 58, the closer the conductive layer 58 is to the semiconductor substrate 10, the longer the conductive layer 58 extends in −Y direction. However, the kerf dummy staircase section 61A is not formed at a position adjacent to the first portion 52a of the second kerf region 52. The kerf dummy staircase section 61A is an example of each of a "second staircase section" and a "second staircase section in which the lengths of the plurality of conductive layers in −Y direction are different from one another".

On the other hand, the kerf dummy staircase section 61B is formed over substantially the entire length of the second kerf region 52. In the kerf dummy staircase section 61B, lengths of the plurality of conductive layers 58 in +Y direction are different from one another.

Next, the stacked section 70 which connects the memory region 29 and the non-memory region 55 will be described.

As illustrated in FIG. 7, the stacked section (i.e., stacked body) 70 is formed between the memory region 29 and the kerf region 50 (e.g., second kerf region 52) in Y direction. The stacked section 70 connects the memory region 29 and the kerf region 50 with substantially the same stacked structure as that of the memory region 29. The stacked section 70 is adjacent to the second side of the memory region 29.

Figure 8:
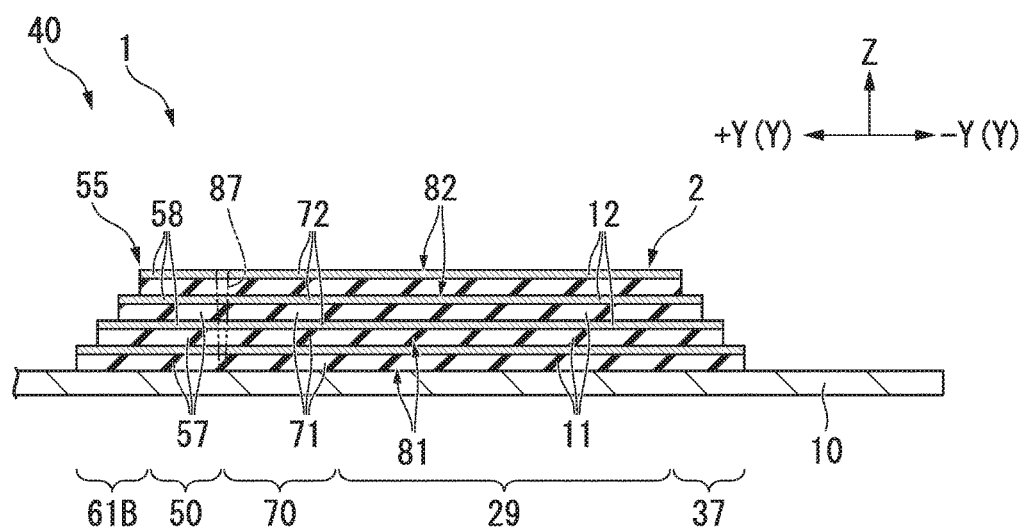
FIG. 8 is a cross-sectional view of the wafer illustrated in FIG. 7 taken along line F8-F8 shown in FIG. 7.

FIG. 8 is a cross-sectional view of the wafer 40 taken along a line F8-F8 illustrated in FIG. 7.

As illustrated in FIG. 8, the stacked section 70 includes a plurality of insulating layers 71 and a plurality of conductive layers 72 that are alternately stacked on the semiconductor substrate 10. The insulating layers 71 and the conductive layers 72 of the stacked section 70 are stacked substantially simultaneously in the same process as that for the insulating layers 11 and 57 and the conductive layers 12 and 58 of the memory region 29 and the kerf region 50, respectively. The insulating layer 71 is an example of each of a "fifth layer part" and a "fifth film". The conductive layer 72 is an example of each of a "sixth layer part" and a "sixth film". The "fifth layer part" in the present embodiment corresponds to an insulating layer included in the stacked section 70 that is located between the memory region 29 and the non-memory region 55. Further, the "sixth layer part" in the present embodiment corresponds to a layer included in the stacked section 70 that is located between the memory region 29 and the non-memory region 55, which is a conductive layer or a sacrificial layer (described below) that has not been replaced with the conductive layer.

As illustrated in FIG. 8, the plurality of insulating layers 71 of the stacked section 70 is formed continuously to a plurality of insulating layers 11 of the memory region 29 and a plurality of insulating layers 57 of the kerf region 50. That is, the plurality of insulating layers 71 of the stacked section 70 connects (e.g., physically connect) the plurality of insulating layers 11 of the memory region 29 and the plurality of insulating layers 57 of the kerf region 50. In other words, an insulating layer 81 including the insulating layers 11, 57, and 71 of the memory region 29, the kerf region 50, and the stacked section 70 is provided continuously over the memory region 29 and the kerf region 50.

Similarly, the plurality of conductive layers 72 of the stacked section 70 is formed continuously to the plurality of conductive layers 12 of the memory region 29 and the plurality of conductive layers 58 of the kerf region 50. That is, the plurality of conductive layers 72 of the stacked section 70 connects (e.g., physically connect) the plurality of conductive layers 12 of the memory region 29 and the plurality of conductive layers 58 of the kerf region 50. In other words, a conductive layer 82 including the conductive layers 12, 58, and 72 of the memory region 29, the kerf region 50, and the stacked section 70 is provided continuously over the memory region 29 and the kerf region 50.

Accordingly, the memory region 29 and the non-memory region 55 are connected (e.g., physically connected) to each other by the plurality of insulating layers 11 of the memory region 29 and the plurality of insulating layers 57 of the non-memory region 55 being connected in Y direction and the plurality of conductive layers 12 of the memory region 29 and the plurality of conductive layers 58 of the non-memory region 55 being connected in Y direction.

A slit-like insulating portion 87 that electrically insulates between the conductive layers 12 of the memory region 29 and the conductive layers 58 of the non-memory region 55 is formed in at least one of the conductive layers 58 of the non-memory region 55 and the conductive layers 72 of the stacked section 70. For example, ends of the stacked section 70 (e.g., ends of the plurality of conductive layers 72) are substantially aligned with a surface (e.g., a side surface) of the slit-like insulating portion 87.

As illustrated in FIG. 7, the stacked section 70 of the present embodiment includes the dummy staircase sections 75. The dummy staircase sections 75 are respectively formed in +X direction and −X direction with respect to a center of the stacked section 70. In the dummy staircase section 75, lengths of the plurality of conductive layers 72 in +X direction or in −X direction are different from one another. That is, among the plurality of the conductive layers 72, the closer the conductive layer 72 is to the semiconductor substrate 10, the longer the conductive layer 72 extends in +X direction or −X direction. The dummy staircase section 75 is an example of a "third staircase section."

The dummy staircase section 75 is formed between the staircase section 32 of the memory cell array 2 and the kerf dummy staircase section 61A. The dummy staircase section 75 connects the staircase section 32 of the memory cell array 2 and the kerf dummy staircase section 61A in Y direction.

Figure 9:
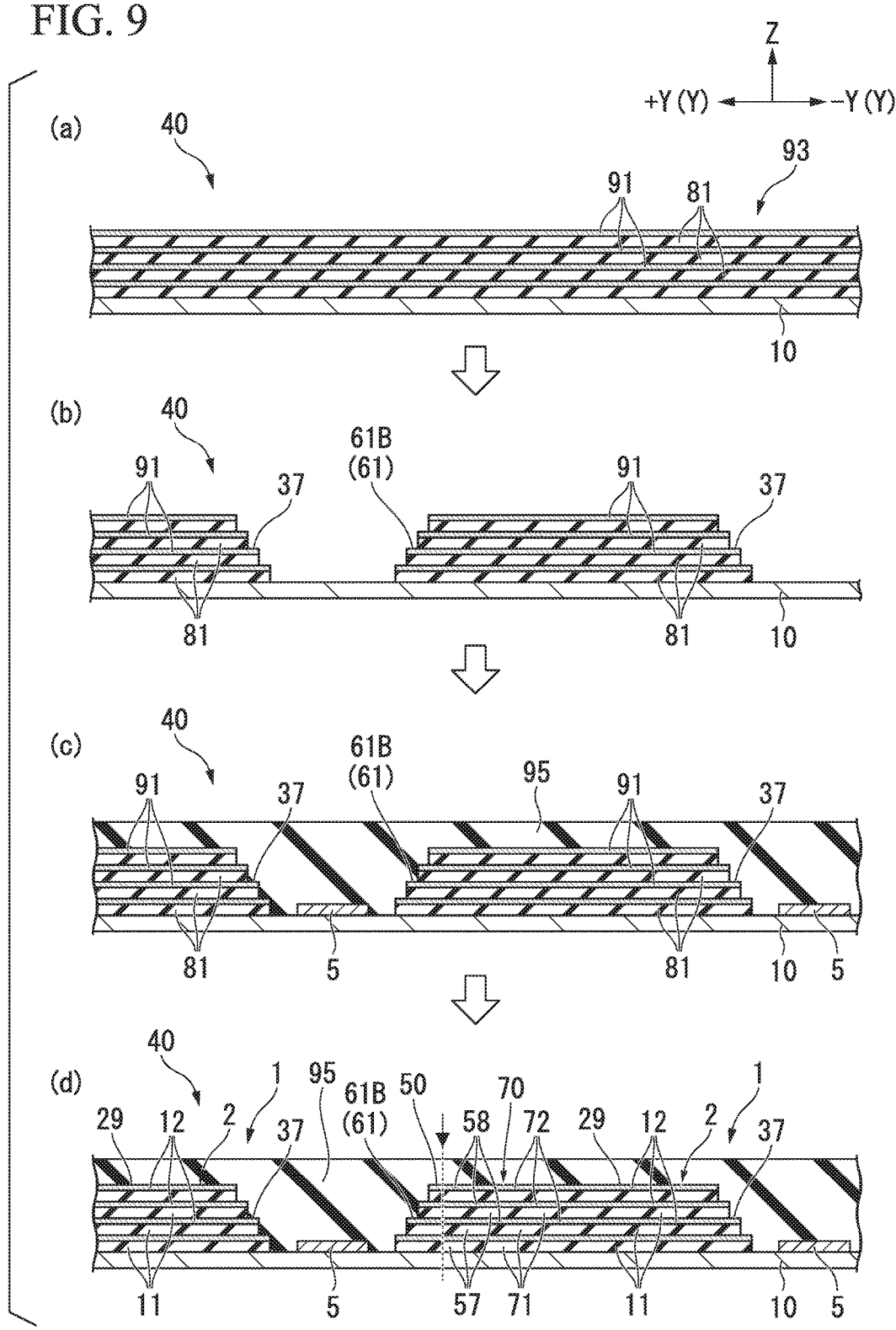
FIG. 9 is a cross-sectional view of a substrate illustrating a method of manufacturing the semiconductor memory device according to the first embodiment.

Next, a method for manufacturing the semiconductor memory device 1 of the present embodiment will be described with reference to FIG. 9. Hereinafter, formation of the memory cell array 2 and the non-memory region 55 will be described. FIG. 9 is a cross-sectional view of the same section as that illustrated in FIG. 8 (section taken along the line F8-F8 of FIG. 7).

First, as illustrated in (a) of FIG. 9, a plurality of insulating layers 81 and a plurality of intermediate layers 91 are alternately stacked on the semiconductor substrate 10, such that the stacked body 93 is formed. The insulating layer 81 is a layer serving as the insulating layers 11, 57, and 71 and is made of, for example, silicon oxide ($SiO_2$). The intermediate layer 91 may be a conductive layer serving as the conductive layers 12, 58, and 72 or may be a sacrificial layer that is to be replaced with the conductive layer 12, 58, or 72 in a subsequent process. The intermediate layer 91 serving as the conductive layers 12, 58, and 72 is made of a conductive material such as tungsten (W) or polysilicon (Poly-Si). The intermediate layer 91 serving as the sacrificial layer is made of, for example, silicon nitride (SiN).

Next, as illustrated in (b) of FIG. 9, slimming and etching are repeatedly performed on the stacked body 93 to form the staircase section 32 and the dummy staircase sections 37, 61, and 75.

Figure 10:
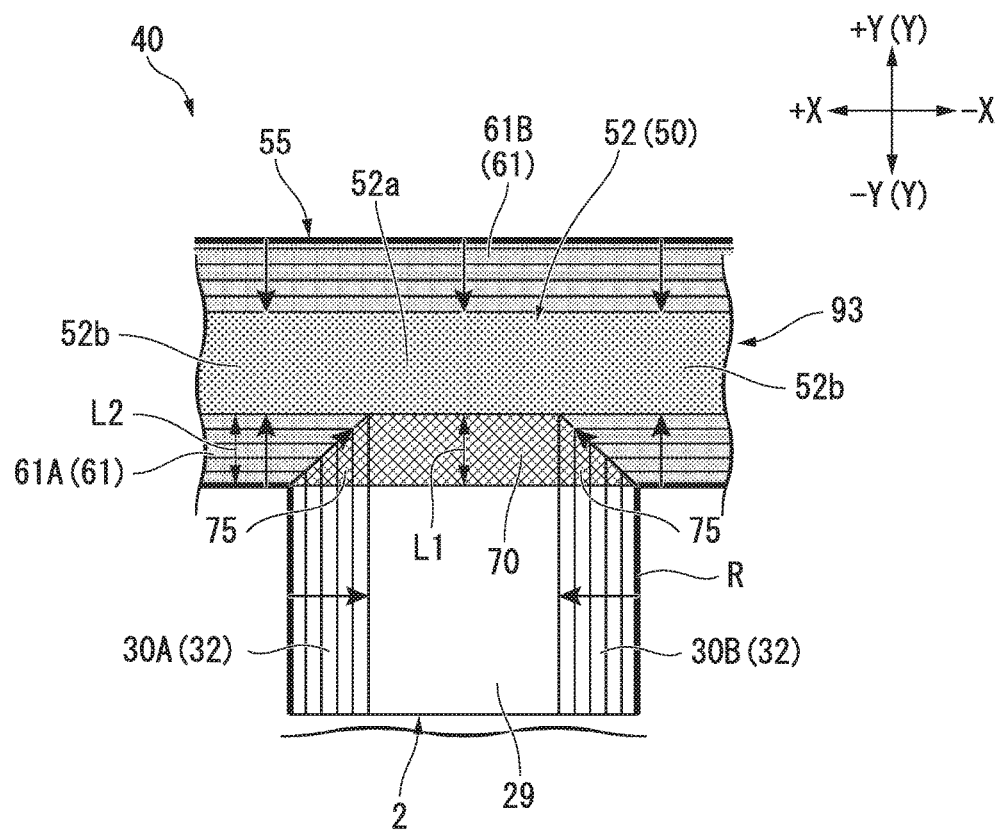
FIG. 10 is a plan view of a part of the wafer illustrated in FIG. 6.

FIG. 10 is a plan view of an enlarged part of the wafer 40.

As illustrated in FIG. 10, a T-shaped resist R is provided on the stacked body 93 so as to extend over the memory region 29 and the second kerf region 52. The resist R is an example of a "mask" formed on the stacked body 93. The resist R covers the stacked section 70 that is located between the memory region 29 and the second kerf region 52. For that reason, in a portion of the stacked body 93 corresponding to the stacked section 70, the stacked structure is maintained even after the slimming and etching process. Further, the resist R is formed to gradually become smaller in each slimming and etching process, as indicated by an arrow in FIG. 10. Accordingly, the dummy staircase section 75 of the stacked section 70 which is formed integrally with the staircase section 32 of the memory cell array 2 and the kerf dummy staircase section 61 is formed in the stacked section 70. As a result, the memory region 29, the non-memory region 55, and the stacked section 70 as illustrated in FIGS. 7 and 8 are formed.

Next, as illustrated in (c) of FIG. 9, an insulating layer 95 is formed on the semiconductor substrate 10 to enclose the stacked body 93. Then, a planarization process is performed. Here, in a case in which the intermediate layer 91 serves as the conductive layers 12, 58, and 72s, the contact plugs 34, the conductive lines 22 and 23, and the like are formed. On the other hand, in a case in which the intermediate layer 91 serves as the sacrificial layer, a process of replacing the intermediate layer 91 with the conductive layers 12, 58, and 72 is performed. Then, the contact plugs 34, the conductive lines 22 and 23, and the like are formed.

As illustrated in (d) of FIG. 9, dicing is performed along the kerf region 50. As a result, the wafer 40 is cut in the kerf region 50, and a plurality of semiconductor memory devices 1 are formed.

According to such a configuration, it is possible to achieve miniaturization of the semiconductor memory device 1.

Here, in a case in which the memory region is located away from the kerf region, a first dummy staircase section that gradually becomes lower from the memory region to the surface of the semiconductor substrate, and a second dummy staircase section that gradually gets higher from the surface of the semiconductor substrate to the kerf region are formed between the memory region and the kerf region. In such a semiconductor memory device, a chip area would increase and miniaturization of the semiconductor memory device may be difficult.

On the other hand, according to the present embodiment, since the memory region 29 and the non-memory region 55 are connected to each other by the stacked structure, it is possible to remove the dummy staircase section between the memory region 29 and the non-memory region 55 (e.g., the second kerf region 52). Thus, it is possible to decrease an area necessary for the dummy staircase section, and achieve a decrease in the chip area.

In the present embodiment, a length (i.e., dimension, e.g., maximum dimension) L1 of the stacked section 70 in +Y direction is the same as or greater than a length (i.e., dimension, e.g., maximum dimension) L2 of the kerf dummy staircase section 61A in +Y direction (see FIG. 10).

According to such a configuration, the staircase section 32 of the memory cell array 2 does not overlap the kerf dummy staircase section 61A. Thus, it is possible to decrease constraints of a layout or shape regarding the staircase section 32 of the memory cell array 2.

According to the method of manufacturing the semiconductor memory device 1 of the present embodiment, the plurality of memory regions 29, the plurality of staircase sections 32, and the non-memory region 55 are formed in the wafer 40, and the wafer 40 is cut in the non-memory region 55 to dice the plurality of semiconductor memory devices 1.

According to such a configuration, it is possible to decrease an area necessary for the dummy staircase section. Thus, it is possible to decrease the chip area.

Figure 11:
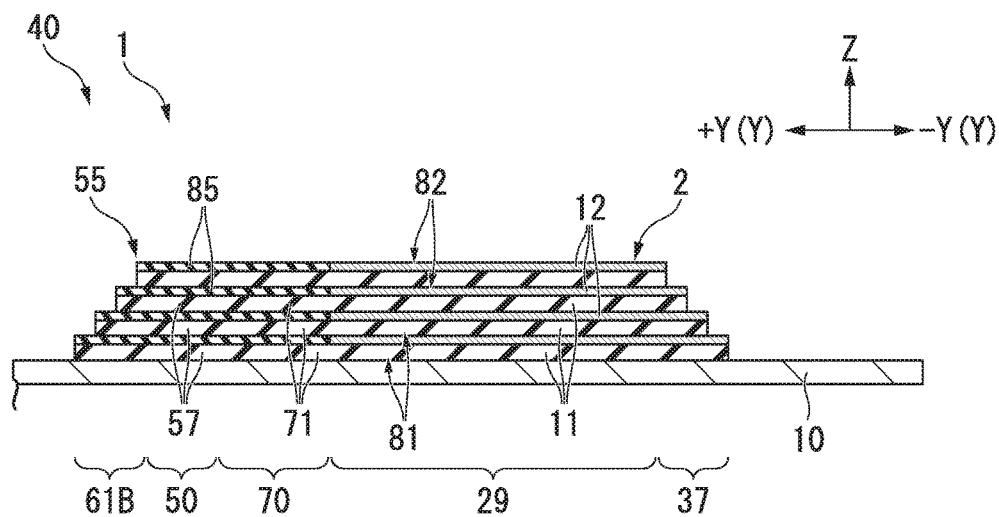
FIG. 11 is a cross-sectional view of a wafer according to a modification of the first embodiment.

Next, a modification of the first embodiment will be described. FIG. 11 illustrates a semiconductor memory device 1 according to the modification of the first embodiment.

Depending on the method of manufacturing the semiconductor memory device 1, the fourth layer parts of the kerf region 50 and the sixth layer parts of the stacked section 70 may not be conductive layers. For example, a plurality of insulating layers and a plurality of sacrificial layers may be alternately stacked on the semiconductor substrate 10, and then, the plurality of sacrificial layers may be replaced with a plurality of conductive layers. In this case, each of the sacrificial layers is made of, for example, silicon nitride (SiN). Here, since the kerf region 50 and the stacked section 70 are regions outside the memory region 29, the replacement of the sacrificial layer with the conductive layer can be omitted. Further, for example, since a silicon nitride layer is more easily cut than a metal layer, a part of the sacrificial layer may be intentionally left in the kerf region 50. For these reasons, materials of at least a portion of the fourth layer parts of the kerf region 50 and at least a portion of the sixth layer parts of the stacked section 70 may be different from that of the conductive layer 12 of the memory region 29. For example, at least a portion of the fourth layer parts of the kerf region 50 and at least a portion of the sixth layer parts of the stacked section 70 may be formed of silicon nitride layers 85.

In summary, "the memory region and the non-memory region are connected to each other", "the plurality of first layer parts and the plurality of third layer parts are connected to each other" and "the plurality of second layer parts and the plurality of fourth layer parts are connected to each other" in the present embodiment may include a case in which the regions or parts are indirectly connected, with another stacked body such as the stacked section 70 disposed therebetween, in addition to a case in which the regions or parts are directly connected to each other. Further, "the memory region and the non-memory region are connected to each other", "the plurality of first layer parts and the plurality of third layer parts are connected to each other" and "the plurality of second layer parts and the plurality of fourth layer parts are connected to each other" in the present embodiment may include a case in which the regions or parts are connected to each other via a plurality of different materials, or a case in which, for example, the source contact LI, the above-described slit-like insulating portion 87, and guard rings 111A and 111B or edge seals 121A and 121B which will be described below are formed between the memory region and the non-memory region, and at least one of the first layer part, the second layer part, the third layer part, the fourth layer part, the fifth layer part, and the sixth layer part is partially cut in the middle, in addition to a case in which the regions or parts are continuously connected to each other by the same material.

Second Embodiment

Next, a second embodiment will be described with reference to FIGS. 12 to 14. The second embodiment is different from the first embodiment in an arrangement of a plurality of semiconductor memory devices 1 in the wafer 40. Other configurations of the second embodiment are the same as those of the first embodiment.

Figure 12:
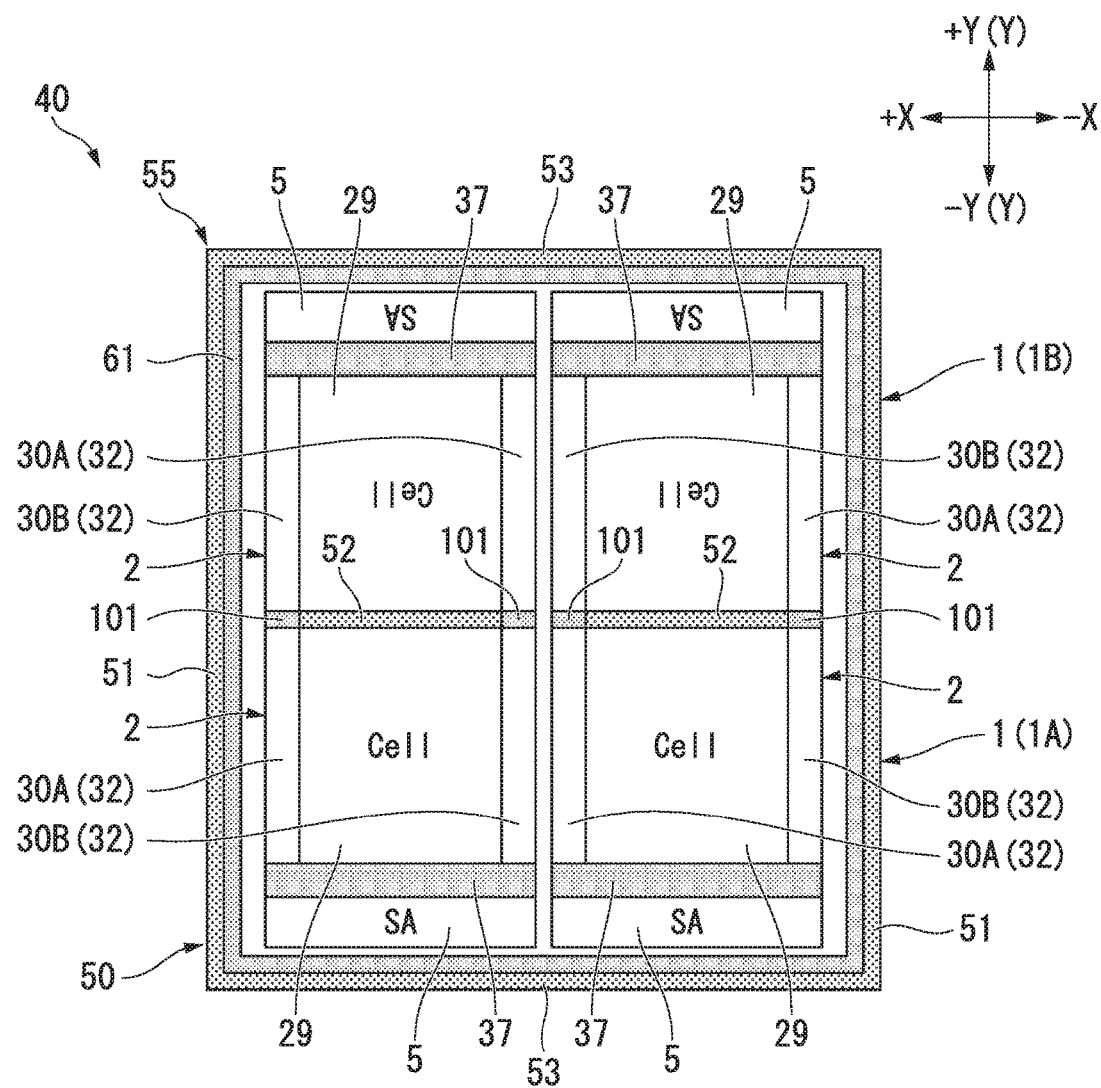
FIG. 12 is a plan view of a part of a wafer according to a second embodiment.

FIG. 12 illustrates a part of the wafer 40 of the present embodiment.

As illustrated in FIG. 12, the wafer 40 includes a plurality of semiconductor memory devices 1 which are arranged adjacent to each other in Y direction. Here, for convenience of description, the plurality of semiconductor memory devices 1 adjacent to each other in Y direction are referred to as a first semiconductor memory device 1A and a second semiconductor memory device 1B.

In the present embodiment, the kerf region 50 includes a pair of first kerf regions 51, one second kerf region 52, and one third kerf region 53. Each of the first kerf regions 51, the second kerf region 52, and the third kerf region 53 has substantially the same stacked structure as that of the kerf region 50 in the first embodiment, and is located in boundaries among the plurality of semiconductor memory devices 1.

In the present embodiment, the second kerf region 52 is formed at a boundary between the first semiconductor memory device 1A and the second semiconductor memory device 1B which are adjacent to each other in Y direction. On the other hand, the third kerf region 53 is located on the side of the memory region 29 of the semiconductor memory device 1 that is opposite to the side of the memory region 29 along which the second kerf region 52 is formed. The third kerf region 53 is formed substantially in parallel with the second kerf region 52, and is connected to the first kerf regions 51. The first kerf region 51 and the third kerf region 53 are formed in a frame shape collectively surrounding the plurality of semiconductor memory devices 1 (e.g., the first semiconductor memory device 1A and the second semiconductor memory device 1B) together in cooperation with each other.

In the present embodiment, the memory region 29 of the first semiconductor memory device 1A and the memory region 29 of the second semiconductor memory device 1B are an example of a pair of memory regions with the second kerf region 52 (i.e., non-memory region 55) disposed therebetween. Further, a sense amplifier 5 of the first semiconductor memory device 1A and a sense amplifier 5 of the second semiconductor memory device 1B are an example of a pair of sense amplifiers.

As illustrated in FIG. 12, the non-memory region 55 of the present embodiment includes kerf dummy staircase sections 101 on both sides of the second kerf region 52. The kerf dummy staircase sections 101 are formed respectively on sides of the second kerf region 52 in +X direction and −X direction. In the kerf dummy staircase sections 101, lengths in +X direction or −X direction of the plurality of conductive layers 58 are different from one another. The kerf dummy staircase section 101 is an example of each of the "fourth staircase section" and the "second staircase section in which the lengths in +X direction or −X direction of the plurality of conductive layers are different from one another".

In the present embodiment, the memory cell arrays 2 and the sense amplifiers 5 of the plurality of semiconductor memory devices 1 are arranged substantially symmetrically (e.g., substantially point-symmetrically or substantially line-symmetrically) with respect to the second kerf region 52. For example, the memory cell array 2 and the sense amplifier 5 of the second semiconductor memory device 1B are disposed at positions obtained by rotating the memory cell array 2 and the sense amplifier 5 of the first semiconductor memory device 1A by 180° with respect to the second kerf region 52.

Figure 13:
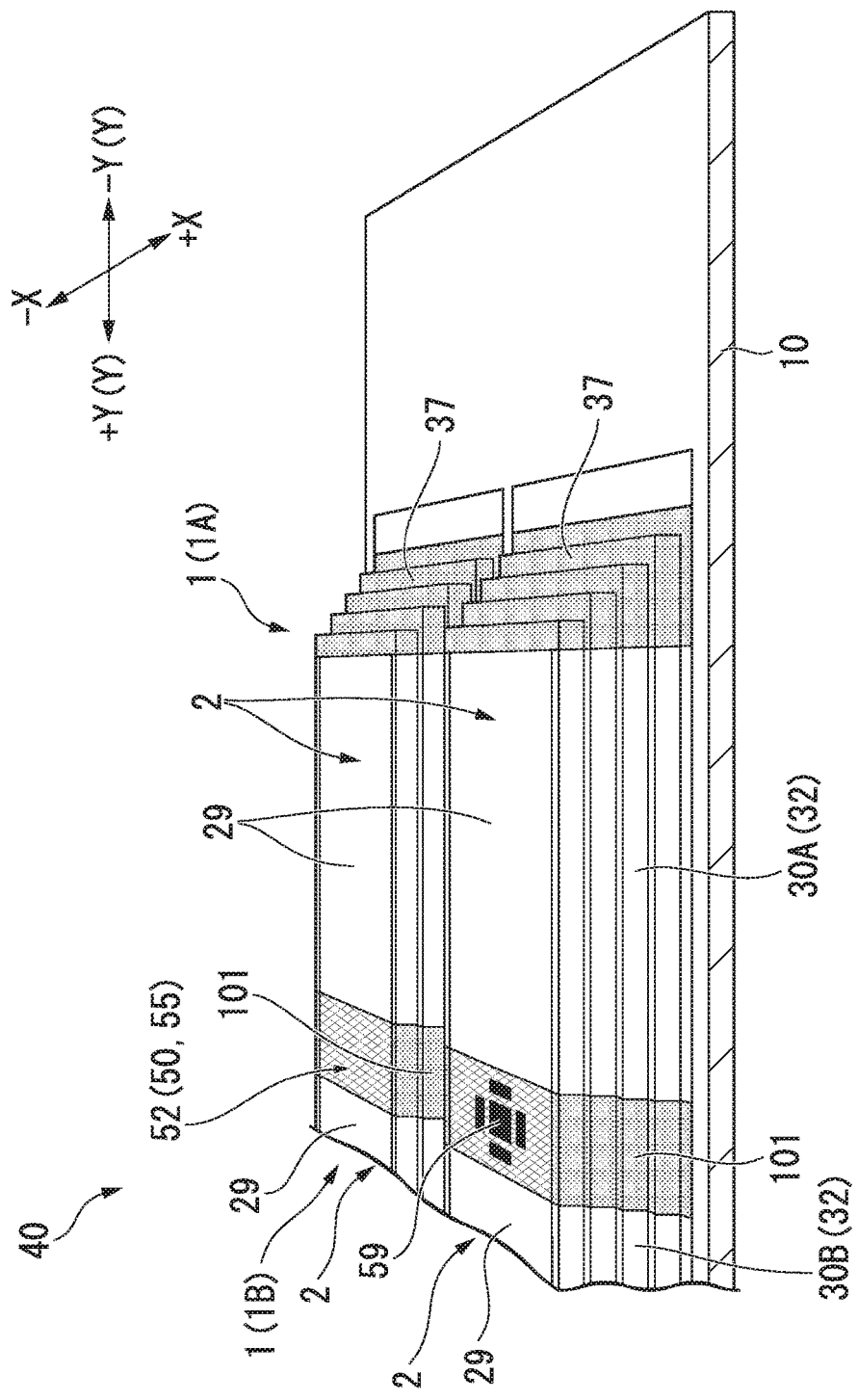
FIG. 13 is a perspective view of a part of the wafer according to the second embodiment.

FIG. 13 is a perspective view of a part of the wafer 40 according to the present embodiment.

As illustrated in FIGS. 12 and 13, the memory region 29 of the first semiconductor memory device 1A is adjacent to the second kerf region 52 in +Y direction. Similarly, the memory region 29 of the second semiconductor memory device 1B is adjacent to the second kerf region 52 in −Y direction.

In the present embodiment, the memory regions 29 of the first and second semiconductor memory devices 1A and 1B and the second kerf region 52 are connected directly (e.g., physically connected directly) to each other. That is, a plurality of insulating layers 11 of the memory regions 29 of the first and second semiconductor memory devices 1A and 1B, and a plurality of insulating layers 57 of the second kerf region 52 are connected directly to each other. A plurality of conductive layers 12 of the memory regions 29 of the first and second semiconductor memory devices 1A and 1B, and a plurality of conductive layers 58 of the second kerf region 52 are connected directly to each other. Further, staircase sections 32 of the first and second semiconductor memory devices 1A and 1B are connected directly to the kerf dummy staircase section 101 in +Y direction or −Y direction.

In other words, in the present embodiment, the memory region 29 of the first semiconductor memory device 1A, the second kerf region 52, and the memory region 29 of the second semiconductor memory device 1B are continuously connected to the stacked structure in Y direction.

Next, a method for manufacturing the semiconductor memory device 1 according to the present embodiment will be described.

Figure 14:
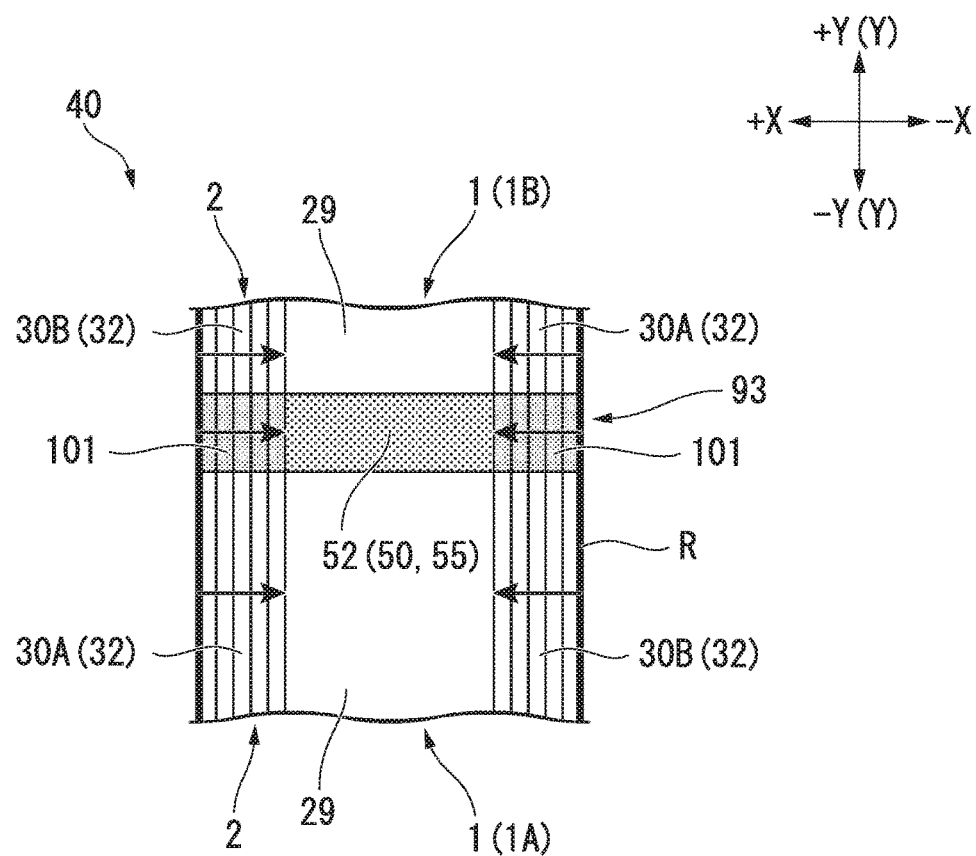
FIG. 14 is a plan view of a part of the wafer according to the second embodiment.

FIG. 14 is a plan view of an enlarged part of the wafer 40.

As illustrated in FIG. 14, an I-shaped resist R is formed on the stacked body 93 over the memory regions 29 of the first and second semiconductor memory devices 1A and 1B and the second kerf region 52. The resist R covers the memory regions 29 of the first and second semiconductor memory devices 1A and 1B and the second kerf region 52. Then, slimming and etching are repeatedly performed on the stacked body 93. As a result, the plurality of memory regions 29 and the second kerf region 52 are formed as illustrated in FIG. 13. Other processes in the method of manufacturing the semiconductor memory device 1 are the same as those in the first embodiment.

According to the configuration of the semiconductor memory device 1 of the present embodiment, it is possible to achieve the miniaturization of the semiconductor memory device 1, as in the first embodiment. Further, in the second embodiment, the memory region 29 is adjacent to the non-memory region 55 in +Y direction. That is, the memory region 29 and the non-memory region 55 are connected to each other by the plurality of first layer parts of the memory region 29 and the plurality of third layer parts of the non-memory region 55 being connected directly to each other, and the plurality of second layer parts of the memory region 29 and the plurality of fourth layer parts of the non-memory region 55 being connected directly to each other. According to such a configuration, it is possible to remove the stacked section 70, unlike the first embodiment. As a result, it is possible to achieve of further reduction of the chip area.

Third Embodiment

Next, a third embodiment will be described with reference to FIG. 15. The third embodiment is different from the first embodiment in that guard rings 111A and 111B are formed in the kerf region 50. Other configurations of a semiconductor memory device 1 according to the third embodiment are the same as those of the first embodiment.

Figure 15:
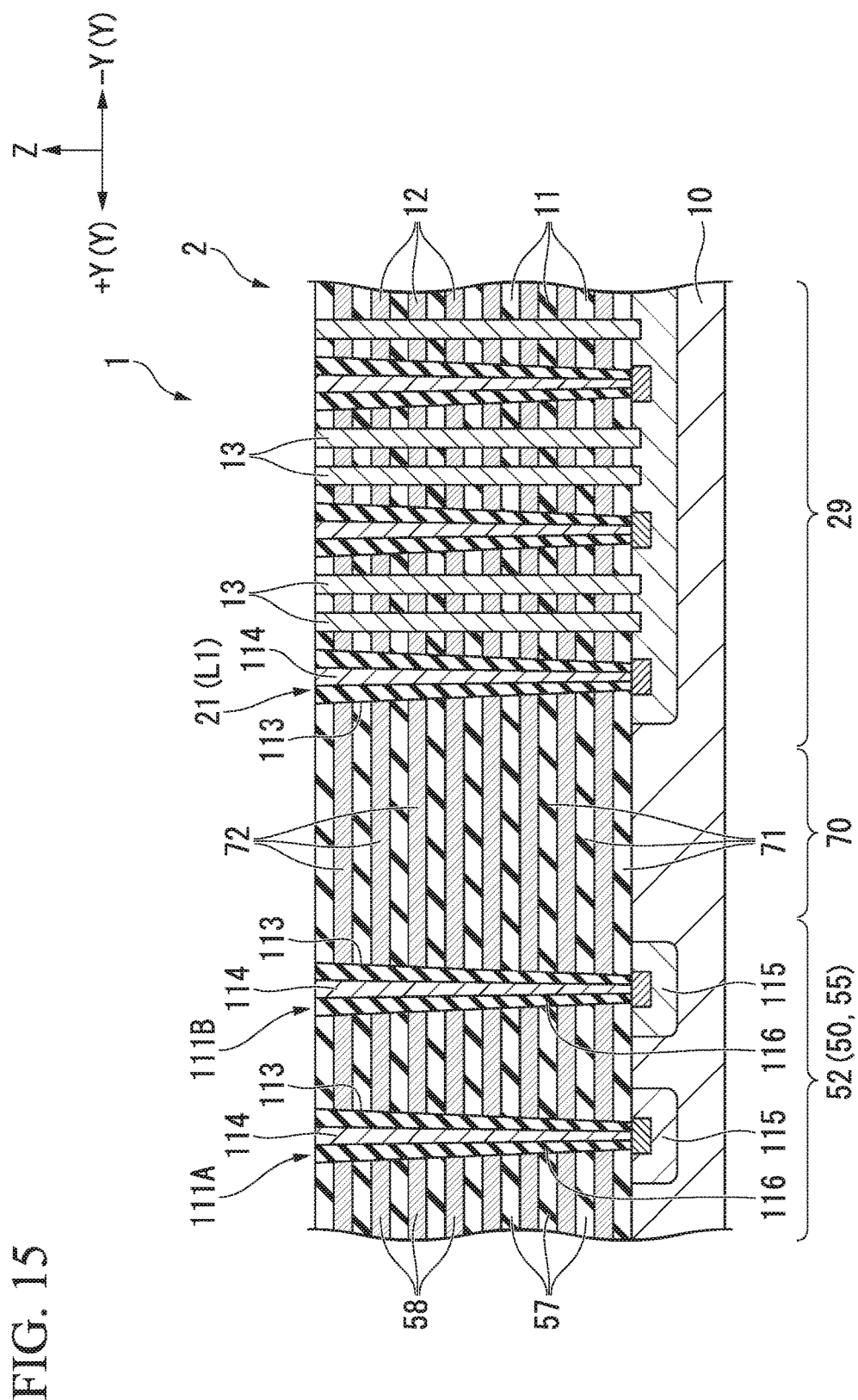
FIG. 15 is a cross-sectional view of a semiconductor memory device according to a third embodiment.

FIG. 15 illustrates the semiconductor memory device 1 of the present embodiment.

As illustrated in FIG. 15, the kerf region 50 of the present embodiment includes a plurality of guard rings 111A and 111B. The guard rings 111A and 111B reach the semiconductor substrate 10 by passing through a plurality of insulating layers 57 and a plurality of conductive layers 58 in Z direction. The guard rings 111A and 111B reach at least a surface of the semiconductor substrate 10. Each of the guard rings 111A and 111B is an example of a "conductor." The "conductor" in the present embodiment is not limited to a portion made of a metal material, and may be a portion made of a conductive material other than metal. Each of the guard rings 111A and 111B includes a slit 113 passing through the plurality of insulating layers 57 and the plurality of conductive layers 58 in Z direction, an insulating layer 116 provided inside the slit 113, and a conductive layer (i.e., conductive material) 114 provided inside the insulating layer 116. The conductive layer 114 is in contact with the semiconductor substrate 10 and is electrically connected to the semiconductor substrate 10. The conductive layer 114 is, for example, made of a metal material.

As illustrated in FIG. 15, the semiconductor substrate 10 includes impurity diffusion regions 115 at places in which the guard rings 111A and 111B are formed. Each of the impurity diffusion regions 115 is, for example, an N-well or a P-well. The impurity diffusion region 115 is formed, for example, by ions being injected into the semiconductor substrate 10 through the slit 113. The guard rings 111A and 111B are connected (e.g., physically connected) to the impurity diffusion region 115 and electrically connected to the impurity diffusion region 115. The guard rings 111A and 111B are set to a ground potential or a desired potential via a wiring (e.g., wiring pattern) (not illustrated). As a result, the potential of the semiconductor substrate 10 is stabilized, and the semiconductor memory device 1 is less susceptible to noise from the outside.

The guard rings 111A and 111B are formed along at least a part of the kerf region 50. At least a part of the guard rings 111A and 111B is provided in a wall shape extending in +X direction or Y direction. The "wall shape" in the present embodiment refers to a flat shape in a certain direction, and includes, for example, a case in which a thickness is different between an upper end portion and a lower end portion. The guard rings 111A and 111B are formed along the circumferential edge of the semiconductor substrate 10. For example, the guard rings 111A and 111B are formed in a frame shape along an outer shape of the semiconductor memory device 1, as indicated by a dashed line in FIG. 18 to be described below. The guard rings 111A and 111B are formed, for example, in a frame shape surrounding the memory region 29 and the sense amplifier 5. In the present embodiment, the guard rings 111A and 111B are formed in a structure in which the memory region 29 and the sense amplifier 5 are doubly surrounded by the two guard rings 111A and 111B. Only one of the guard rings 111A and 111B may be provided.

The guard rings 111A and 111B are the same as the source contact LI in that the slit 113, the insulating layer 116, and the conductive layer 114 are included. For example, the guard rings 111A and 111B are formed to pass through the non-memory region 55, but are formed substantially simultaneously with the source contact LI during the process in which the source contact LI is formed.

The conductor is not limited to a conductor that is provided in a wall shape such as the guard rings 111A and 111B. The conductor may be formed of a hole (e.g., circular hole) reaching the semiconductor substrate 10 by passing through the plurality of insulating layers 57 and the plurality of conductive layers 58 in Z direction, and a conductive material provided inside the hole.

Figure 16:
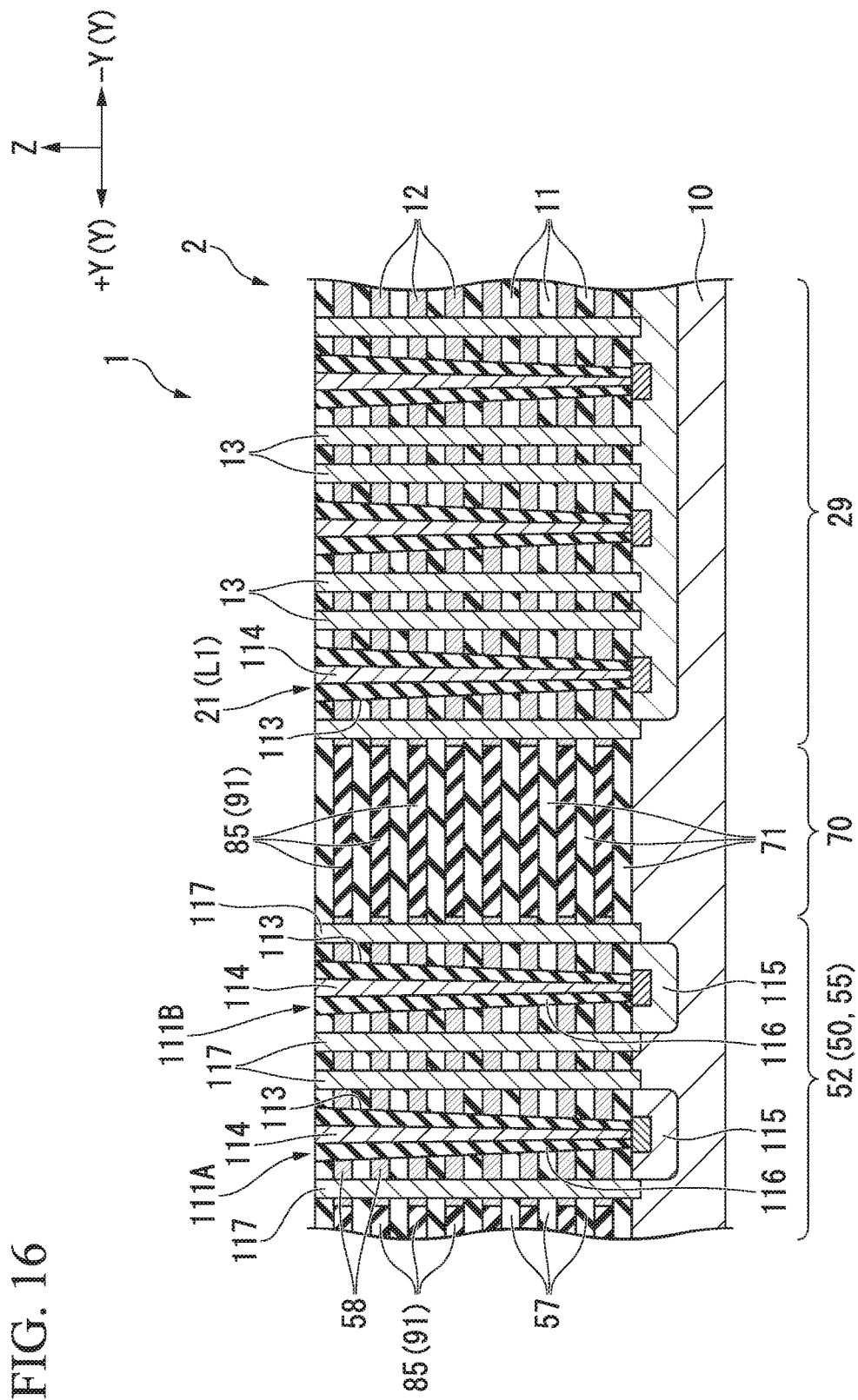
FIG. 16 is a cross-sectional view of a semiconductor memory device according to a modification of the third embodiment.

Here, FIG. 16 illustrates a modification of the semiconductor memory device 1 according to the third embodiment.

The semiconductor memory device 1 according to the modification illustrated in FIG. 16 includes the intermediate layers 91 (hereinafter referred to as sacrificial layers 91 for convenience of description) stacked alternately with the insulating layers 81 being replaced with conductive layers when the semiconductor memory device 1 is manufactured. The semiconductor memory device 1 according to the present modification includes a plurality of support columns 117 near the guard rings 111A and 111B (e.g., on both sides of the guard rings 111A and 111B) in the kerf region 50. The support columns 117 support the insulating layers 57 when the sacrificial layers 91 are removed. The support columns 117 have, for example, substantially the same configuration as that of the memory pillars 13.

Since the stacked section 70 performs no operation during a device operation, the sacrificial layers 91 can be left in the stacked section 70. In the present modification, in the stacked section 70 of the semiconductor memory device 1 after being manufactured, at least a part of the sacrificial layer 91 is not removed, and is left, for example, as the silicon nitride layer 85 in the semiconductor memory device 1. In the present modification, the entire stacked section 70 serves as an insulating body. Therefore, an insulation characteristic between the memory region 29 and the non-memory region 55 is ensured even without the slit-like insulating portion 87.

Fourth Embodiment

Next, a fourth embodiment will be described with reference to FIGS. 17 and 18. The fourth embodiment is different from the first embodiment in that edge seals 121A and 121B are formed in the kerf region 50. Other configurations of the fourth embodiment are the same as those of the third embodiment.

Figure 17:
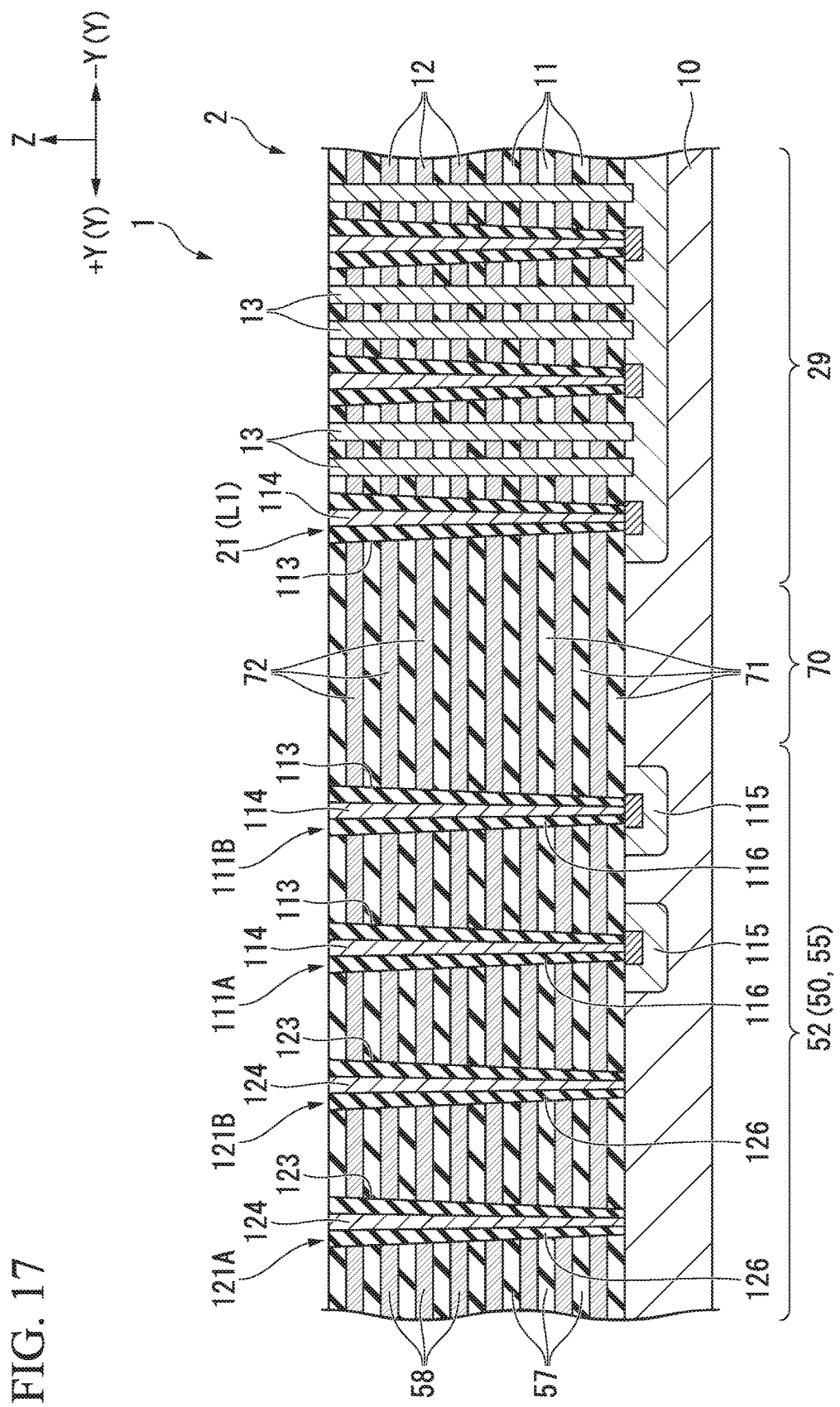
FIG. 17 is a cross-sectional view of a semiconductor memory device according to a fourth embodiment.

FIG. 17 illustrates a semiconductor memory device 1 according to the present embodiment. As illustrated in FIG. 17, a kerf region 50 of the present embodiment includes a plurality of edge seals 121A and 121B. For example, the edge seals 121A and 121B are disposed on the outer peripheral side of guard rings 111A and 111B with respect to a center of each semiconductor memory device 1. The edge seals 121A and 121B may be formed in the semiconductor memory device 1 without the guard rings 111A and 111B.

The edge seals 121A and 121B reach the semiconductor substrate 10 by passing through a plurality of insulating layers 57 and a plurality of conductive layers 58 in Z direction. The edge seals 121A and 121B reach at least a surface of the semiconductor substrate 10. Each of the edge seals 121A and 121B is an example of "metal." Each of the edge seals 121A and 121B includes a slit 123 passing through the plurality of insulating layers 57 and the plurality of conductive layers 58 in Z direction, an insulating layer 126 formed inside the slit 123, and a metal layer (i.e., metal material) 124 formed inside the insulating layer 126.

Figure 18:
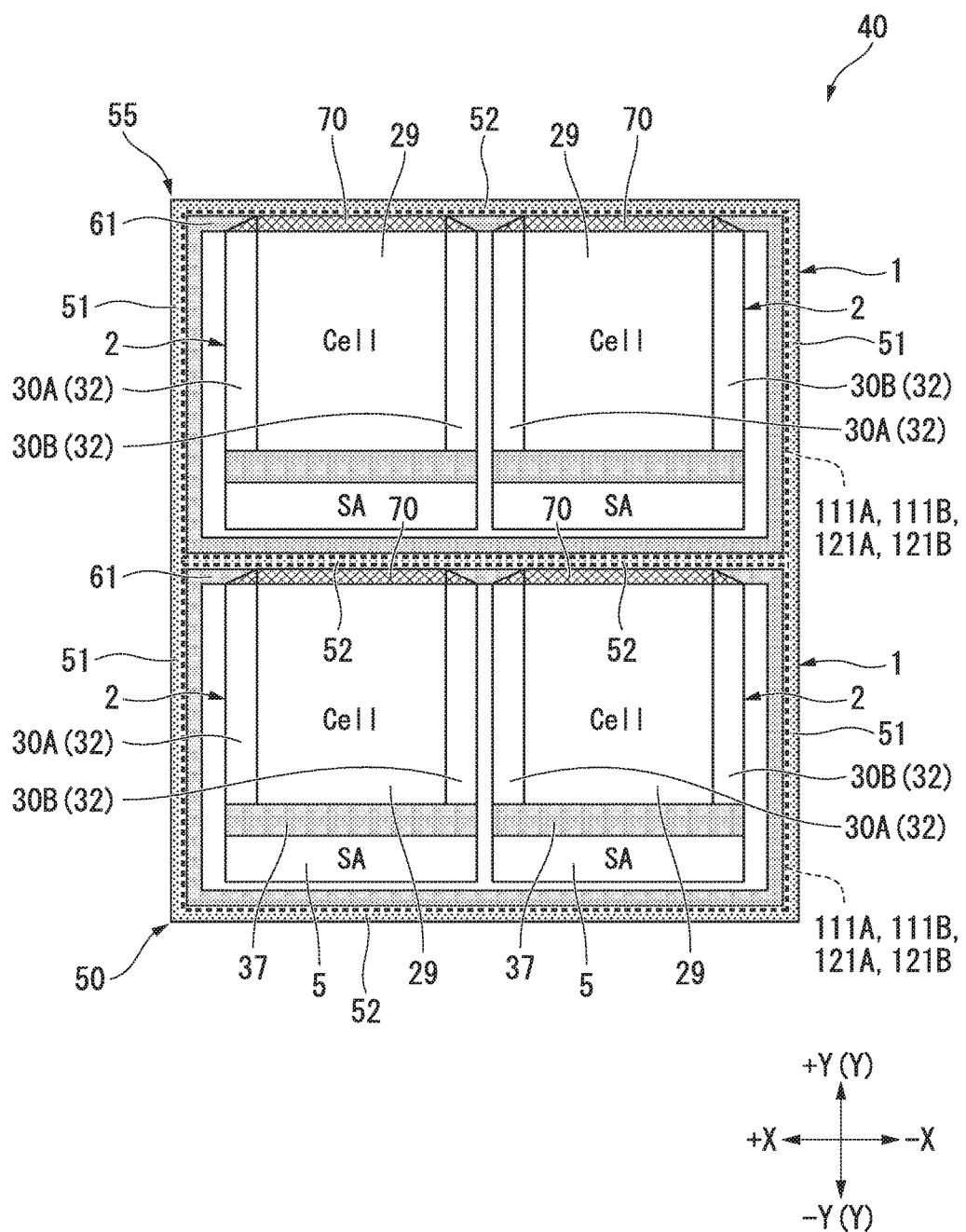
FIG. 18 is a plan view of a part of a wafer according to the fourth embodiment.

FIG. 18 is a plan view of a part of the wafer 40 of this embodiment.

As indicated by a dashed line in FIG. 18, the edge seals 121A and 121B are formed along at least a part of the kerf region 50. At least a part of the edge seals 121A and 121B is provided in a wall shape extending in +X direction or Y direction. The edge seals 121A and 121B are formed along the circumferential edge of the semiconductor substrate 10. For example, the edge seals 121A and 121B are formed in a frame shape along the outer shape of the semiconductor memory device 1. The edge seals 121A and 121B are formed, for example, in a frame shape surrounding the memory region 29 and the sense amplifier 5. In the present embodiment, each of the edge seals 121A and 121B is formed so as to surround the memory region 29 and the sense amplifier 5. However, only one of the edge seals 121A and 121B may be provided.

The edge seals 121A and 121B are the same as the source contact LI in that the slit 123, the insulating layer 126, and the metal layer 124 are included. For example, the edge seals 121A and 121B are formed to pass through the non-memory region 55, but are formed substantially simultaneously with the source contact LI during the process in which the source contact LI is formed.

According to this configuration, it is possible to achieve miniaturization of the semiconductor memory device 1, similarly to the first embodiment. Further, since the edge seal 121A is provided, the non-memory region 55 (e.g., kerf region 50) is reinforced, and it is possible to achieve, for example, suppression of cracks occurring at the time of dicing.

Figure 19:
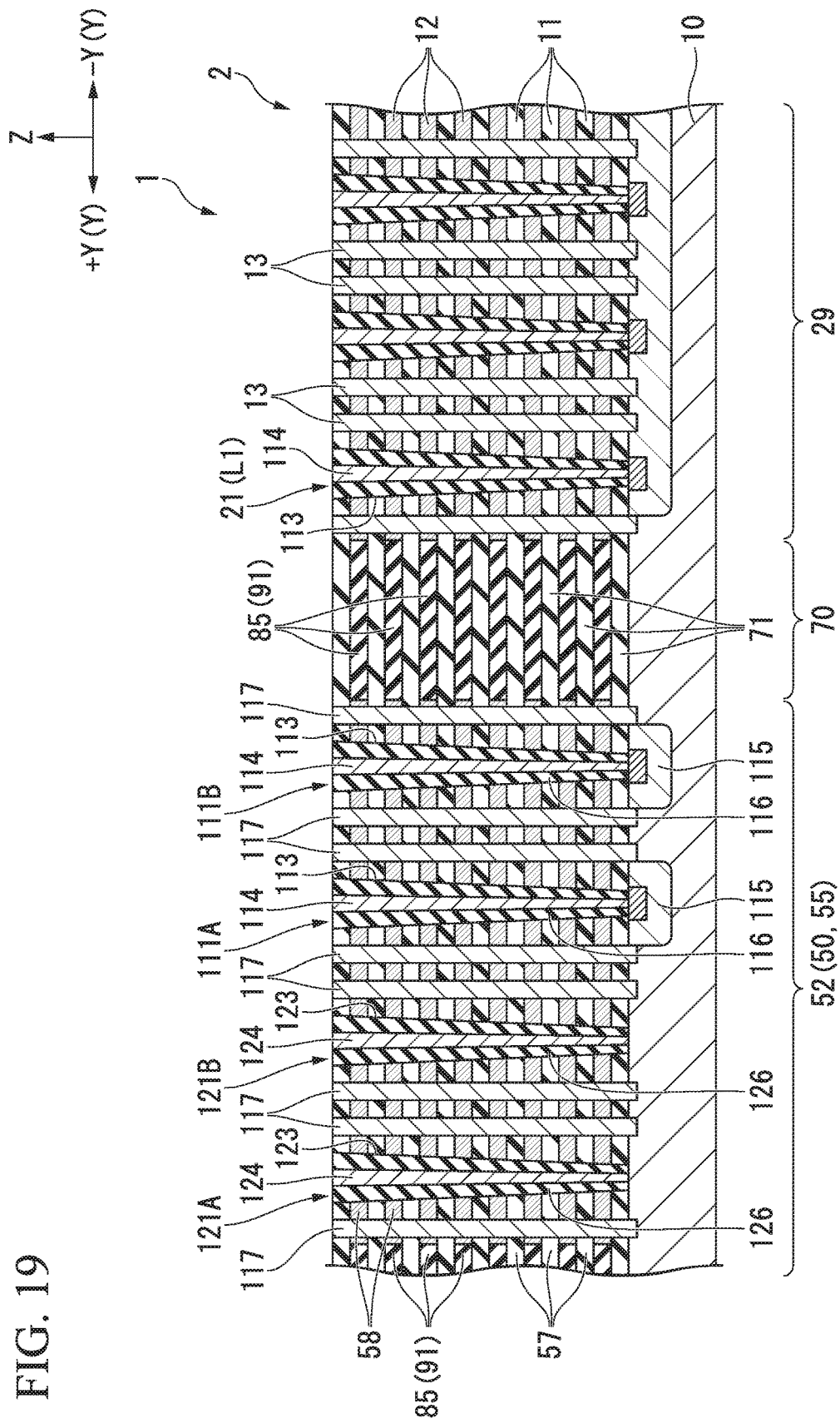
FIG. 19 is a cross-sectional view of a semiconductor memory device according to a modification of the fourth embodiment.

FIG. 19 illustrates a modification of the semiconductor memory device 1 according to the fourth embodiment.

In the semiconductor memory device 1 illustrated in FIG. 19, at least a part of the sacrificial layer 91 is not removed and is left, for example, as the silicon nitride layer 85 in the stacked section 70, similarly to the semiconductor memory device 1 illustrated in FIG. 16. The semiconductor memory device 1 of the present modification includes a plurality of support columns 117 near the edge seals 121A and 121B (e.g., on both sides of the edge seals 121A and 121B) in the kerf region 50. In the present modification, for example, the entire stacked section 70 serves as an insulating body. For that reason, an insulation characteristic between the memory region 29 and the non-memory region 55 is ensured even without the slit-like insulating portion 87.

The first to fourth embodiments and the modifications thereof have been described above. However, the configurations of the embodiments are not limited to the above. For example, a memory string MS may have a U shape folded back on the opposite side in the memory string MS. The memory cell MC is not limited to a Metal-Oxide-Nitride-Oxide-Semiconductor (MONOS) type memory cell, and may be, for example, a Semiconductor-Oxide-Nitride-Oxide-Semiconductor (SONSO) type memory cell or a floating gate type memory cell.

Further, each semiconductor memory device 1 may include one memory cell array 2 and one sense amplifier 5.

According to at least one embodiment described above, a memory region and a non-memory region are connected to each other by at least a plurality of first layer parts of the memory region and a plurality of third layer parts of the non-memory region being connected to each other and a plurality of second layer parts of the memory region and a plurality of fourth layer parts of the non-memory region being connected to each other. According to such a configuration, it is possible to achieve miniaturization of the semiconductor memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate that has a memory region extending in first and second directions along a surface of the substrate, a step region that is adjacent to the memory region in the first direction and extends in the second direction, and a non-memory peripheral region that is adjacent to the memory region and the step region in the second direction and extends in the first direction;
   a plurality of insulating layers and a plurality of wiring layers that are alternately formed on the memory region and the step region of the substrate, wherein widths of the insulating layers on the step region in the first direction and widths of the wiring layers on the step region in the first direction, respectively, become narrower as a distance from the substrate increases; and
   a plurality of first layers and a plurality of second layers that are alternately formed on the non-memory peripheral region of the substrate, each of the first layers being formed on a same level as and in contact with one of the insulating layers, and each of the second layers being formed on a same level as and in contact with one of the wiring layers.

2. The semiconductor memory device according to claim 1, wherein
   each of the first layers is formed of an insulating material that is same as a material of the insulating layers, and integrally formed with the corresponding one of the insulating layers on the same level.

3. The semiconductor memory device according to claim 2, wherein
   each of the second layers is formed of a conductive material that is same as a material of the wiring layers, and integrally formed with the corresponding one of the wiring layers on the same level.

4. The semiconductor memory device according to claim 2, wherein
   each of the second layers is formed of an insulating material.

5. The semiconductor memory device according to claim 2, wherein
   each of the second layers has a portion formed of a conductive material that is same as a material of the wiring layers and a portion formed of an insulating material.

6. The semiconductor memory device according to claim 1, wherein each of the first layers and each of the second layers extend along an entire edge of the substrate.

7. The semiconductor memory device according to claim 6, wherein
widths of the first layers on a sub-region of the non-memory peripheral region in the second direction and widths the second layers on the sub-region in the second direction, respectively, become narrower as a distance from the substrate increases.

8. The semiconductor memory device according to claim 6, further comprising:
a conductive wall that penetrates the first and second layers on the non-memory peripheral region and extends along the edge of the substrate; and
an insulating cover layer that covers side surfaces of the conductive wall.

9. The semiconductor memory device according to claim 1, wherein
each of the first layers and each of the second layers extend partially along an edge of the substrate.

10. The semiconductor memory device according to claim 9, wherein
widths of the first layers on the non-memory peripheral region in the first direction and widths the second layers on the non-memory peripheral region in the first direction, respectively, become narrower as a distance from the substrate increases.

11. The semiconductor memory device according to claim 1, further comprising:
a sense amplifier disposed on a region of the substrate that is adjacent to a side of the memory region in the second direction that is opposite to a side of the memory region adjacent to the non-memory peripheral region.

12. The semiconductor memory device according to claim 1, wherein
at least part of an alignment mark is formed on an upper most layer of the first and second layers.

13. The semiconductor memory device according to claim 1, further comprising:
a plurality of conductive pillars that penetrates the first and second layers on the non-memory peripheral region of the substrate.

14. The semiconductor memory device according to claim 1, wherein
part of the wiring layers serve as word lines.

15. The semiconductor memory device according to claim 1, wherein
a dicing surface is formed on side surfaces of the first layers and side surface of the second layers.

16. A method for manufacturing a semiconductor memory device, comprising:
alternately forming a first insulating layer and a second insulating layer a plurality of times, on a first region of a substrate that extends in first and second directions, a second region of the substrate that is adjacent to the first region in the first direction and extends in the second direction, and a third region of the substrate that is adjacent to the first and second regions in the second direction and extends in the first direction;
forming a plurality of pillars that penetrates the first insulating layers and the second insulating layers in the first region;
selectively replacing each of the second insulating layers on the first region with a conductive layer, while leaving the second insulating layer on the third region; and
cutting the first insulating layers, the second insulating layers, and the substrate on the third region in the first direction.

17. The method according to claim 16, further comprising:
carrying out patterning of different one of the first insulating layers and different one of the second insulating layers a plurality of times, such that a step structure made of the first and second insulating layers is formed on the second region of the substrate.

18. The method according to claim 16, further comprising:
forming a sense amplifier on a fourth region of the substrate along a side of the first region extending in the second direction that is opposite to a side of the first region adjacent to the second region.

19. The method according to claim 16, wherein
each of the first insulating layers and each of the second insulating layers are formed entirely along a cutting line of the substrate.

20. The method according to claim 16, wherein
each of the first insulating layers and each of the second insulating layers are formed partially along a cutting line of the substrate.

* * * * *